US010372765B2

(12) United States Patent
Knaapen et al.

(10) Patent No.: US 10,372,765 B2
(45) Date of Patent: Aug. 6, 2019

(54) ASSISTING A USER IN SELECTING A LIGHTING DEVICE DESIGN

(71) Applicant: SIGNIFY HOLDING B.V., Eindhoven (NL)

(72) Inventors: Bram Knaapen, Eindhoven (NL); Petrus Johannes Hendrikus Seuntiens, Hoogeloon (NL); Chris Damkat, Eindhoven (NL); Bartel Marinus Van De Sluis, Eindhoven (NL); Wei Pien Lee, Eindhoven (NL); Stefan Donivan Twigt, Dordrecht (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 261 days.

(21) Appl. No.: 14/438,372

(22) PCT Filed: Oct. 24, 2013

(86) PCT No.: PCT/IB2013/059615
§ 371 (c)(1),
(2) Date: Apr. 24, 2015

(87) PCT Pub. No.: WO2014/064640
PCT Pub. Date: May 1, 2014

(65) Prior Publication Data
US 2015/0286724 A1 Oct. 8, 2015

(30) Foreign Application Priority Data

Oct. 24, 2012 (EP) .................................... 12189754
Oct. 14, 2013 (EP) .................................... 13188485

(51) Int. Cl.
G06F 17/50 (2006.01)
G06F 16/951 (2019.01)
(Continued)

(52) U.S. Cl.
CPC ............ *G06F 16/951* (2019.01); *G06F 17/50* (2013.01); *G06Q 30/0277* (2013.01); *G09G 3/32* (2013.01); *H05B 37/029* (2013.01)

(58) Field of Classification Search
None
See application file for complete search history.

(56) References Cited

U.S. PATENT DOCUMENTS 5,255,206 A * 10/1993 Pegis .................. H05B 37/029
703/1
7,062,722 B1 * 6/2006 Carlin .................. G06Q 30/02
715/781
(Continued)

FOREIGN PATENT DOCUMENTS

WO 2012049656 A2 4/2012

OTHER PUBLICATIONS

Robert Brauer et al, "Automated Interior Design from A to Z", University of Applied Sciences.
(Continued)

*Primary Examiner* — Rehana Perveen
*Assistant Examiner* — Cuong V Luu
(74) *Attorney, Agent, or Firm* — Meenakshy Chakravorty

(57) ABSTRACT

The present invention relates to suggesting a lighting device (408) design to a user, such as in an advertisement for a lighting device design. The suggestion is based on acquiring user interest information relating to the user from a data source such as an online user profile. A lighting device (408) design related variable (e.g. intensity, colour temperature) is determined based on the acquired user interest information using, for example, a lookup table or rules. A lighting device (408) design is then provided (e.g. selected or generated)
(Continued)

based on the lighting device design related variable and an image (410) of the provided lighting device (408) design is displayed.

20 Claims, 17 Drawing Sheets

(51) Int. Cl.
*H05B 37/02* (2006.01)
*G06Q 30/02* (2012.01)
*G09G 3/32* (2016.01)

(56) References Cited

U.S. PATENT DOCUMENTS

| | | | | |
|---|---|---|---|---|
| 8,734,163 | B1* | 5/2014 | Gordin | G09B 25/04 434/367 |
| 9,019,296 | B1* | 4/2015 | Abraham | G06Q 30/02 345/593 |
| 2002/0093538 | A1* | 7/2002 | Carlin | G06Q 30/02 715/778 |
| 2003/0164968 | A1* | 9/2003 | Iida | H04N 1/6058 358/1.9 |
| 2005/0081161 | A1* | 4/2005 | MacInnes | G06F 17/5004 715/765 |
| 2007/0150368 | A1* | 6/2007 | Arora | G06Q 30/02 705/26.1 |
| 2007/0258243 | A1* | 11/2007 | Segall | H05B 37/02 362/276 |
| 2008/0320126 | A1* | 12/2008 | Drucker | G06Q 30/00 709/224 |
| 2009/0160856 | A1* | 6/2009 | Hoguet | G06Q 10/06 345/420 |
| 2010/0001992 | A1* | 1/2010 | Schultz | G06T 19/00 345/419 |
| 2010/0235309 | A1* | 9/2010 | Boleko Ribas | H05B 33/0863 706/13 |
| 2011/0022396 | A1* | 1/2011 | Van De Sluis | H05B 37/0236 704/275 |
| 2011/0115413 | A1 | 5/2011 | Erickson et al. | |
| 2011/0245939 | A1* | 10/2011 | Crookham | G06Q 90/00 700/90 |
| 2012/0050254 | A1* | 3/2012 | Gordin | G06T 15/50 345/418 |
| 2012/0101554 | A1 | 4/2012 | Feather et al. | |
| 2012/0310703 | A1* | 12/2012 | Cavalcanti | G06Q 30/0201 705/7.29 |
| 2013/0005458 | A1* | 1/2013 | Kosta | G07F 17/3206 463/31 |
| 2013/0158952 | A1* | 6/2013 | Liebel | G06F 15/00 702/182 |
| 2013/0214698 | A1* | 8/2013 | Aliakseyeu | G06F 3/011 315/292 |
| 2013/0253942 | A1* | 9/2013 | Liu | G06Q 10/06 705/2 |
| 2016/0307602 | A1* | 10/2016 | Mertens | G11B 27/11 |
| 2016/0323972 | A1* | 11/2016 | Bora | H05B 33/0842 |

OTHER PUBLICATIONS

Lap-Fai Yu et al, "Make it Home: Automatic Optimization of Furniture Arrangement", ACM Transactions on Graphics, vol. 30, No. 4, Article 86, Jul. 2011, pp. 86.1-86.11.
Kari Anne Hoier Kjolaas, "Automatic Furniture Population of Large Architectural Models", Thesis, Depart. of Electrical Engineering and Computer Science, Jan. 2000, pp. 1-66.

* cited by examiner

ASSISTING A USER IN SELECTING A LIGHTING DEVICE DESIGN

CROSS-REFERENCE TO PRIOR APPLICATIONS

This application is the U.S. National Phase application under 35 U.S.C. § 371 of International Application No. PCT/IB2013/059615, filed on Oct. 24, 2013, which claims the benefit of European Patent Application No. 12189754.0, filed on Oct. 24, 2012 and 13188485.0, filed on Oct. 14, 2013. These applications are hereby incorporated by reference herein.

FIELD OF THE INVENTION

The invention relates to a method, system and computer program product for selecting a lighting device design.

BACKGROUND OF THE INVENTION

Selecting a lighting device design online requires a user to browse through a collection of lighting device designs being offered. This is similar to browsing through a paper catalogue. The online service optionally includes a function to search for lighting device designs based on search criteria, such as type of device, brand, price range, etc. Although this is an improvement over a paper catalogue, the process remains essentially the same. The user selects a lighting device design merely by comparing it to another lighting device design.

SUMMARY OF THE INVENTION

It is an object of the present invention to provide an improved solution for selecting a lighting device design. In a first aspect of the invention this object is achieved in that a method is provided that suggests a lighting device design to a user. The method comprises the steps of: acquiring user interest information relating to a user; determining a lighting device design related variable based on the acquired user interest information; providing a lighting device design based on the lighting device design related variable; and displaying an image of the provided lighting device design. User interest information can be acquired from one or more data sources, such as data stored on the user's computer device (e.g. cookies stored in a browser cache, location information of a smart phone), data acquired through a web service (e.g. a Facebook profile, an online store) or an image or text the user has created (e.g. a picture the user has taken or an email the user is writing). The data of these examples as well as other data that relates to the user, either directly or indirectly, can be considered user interest information. A lighting device design related variable, such as lighting device design type (e.g. ceiling lamp, desk lamp) or color, can be determined based on user interest information using lookup tables (e.g. when the user interest information comprises the keyword 'desk' the lookup tables provide as lighting device design related variable a 'lighting device design type' with a value 'desk lamp'), rules (e.g. if user profile shows emotional state is 'in love' then lighting device design style is 'romantic'), fuzzy logic, etc. Acquired user interest information can optionally be combined or compared to determine with greater confidence a lighting device related variable (e.g. acquiring similar or contrasting user interest information from various sources). Providing a lighting device design based on the determined lighting device design related variable can, for example, comprise selecting a lighting device design (e.g. from an electronic catalogue of lighting device designs) or generating a lighting device design (e.g. based on modifying a base model). An image of the lighting device design can then be displayed to the user, for example through a banner advertisement on a website.

In an embodiment of the method according to the invention, the method further comprises the step of determining a lighting property of the lighting device design based on the acquired user interest information and/or the context in which the image of the provided lighting device design will be displayed; and wherein the image of the generated lighting device design displayed to the user comprises a lighting effect based on the determined lighting property. A lighting property of the lighting device design, such as the beam angle or the color of light emitted, can be determined based on user interest information (e.g. if the user has posted a message that (s)he is sad that summer is over, determining as a lighting property the color yellow, to provide a summer-like feeling) or on the context in which the image of the provided lighting device design is displayed (e.g. if the image is displayed as part of an advertisement banner on a website with a grey background color, determining as a lighting property the color purple to make the advertisement stand out against the grey background).

In various embodiments of the method according to the invention, the step of acquiring user interest information comprises acquiring a keyword, an image or a location related to the user and the lighting device related variable is determined based on respectively the acquired keyword, image or location. As an example, a keyword related to a user can be a word from a search query entered by the user (e.g. a word in a phrase the user enters in the search field in a search engine website), a word from a text displayed to the user (e.g. a word in a text on a website), a word stored in a user profile of the user (e.g. a word in a profile of the user on a social network or a word, such as order details, in the order history stored in a user profile in an online store) or one or more words related to the user acquired from another source. As a further example, an image related to the user can be acquired and analyzed, such as an image stored on the user's computer device, in a virtual drive hosted online, part of a user's online profile (e.g. on a dating site or a professional networking site), etc. As yet another example, a lighting device design related variable can be based on a location related to the user, such as the user's current location (e.g. based on the GPS coordinates provided by the user's smart phone), a location the user has visited (e.g. based on GPS coordinates stored in EXIF data in an image file), the user's home address (e.g. based on a user profile created as part of an ordering process), etc.

In an embodiment of the method according to the invention, the step of generating a lighting device design is further based on user interest information related to at least one other user. As an example, trends can be determined based on user interest information related to other users (e.g. most popular color of a lighting device design) or user interest information relating to family or friends of the user (i.e. other users that are part of the user's social network) can be the basis for determining a lighting device design related variable.

In an especially advantageous embodiment of the method according to the invention, the step of displaying the image of the generated lighting device design comprises displaying an advertisement featuring the image of the generated lighting device design. Such an advertisement can comprise a banner advertisement on a website, a video showing the lighting device design displayed before a user selected video starts loading, an advertisement shown in an application on a smart phone, a pop up advertisement shown on an e-book reader, etc.

A second aspect of the invention provides a computer program product implementing the method according to the invention. The computer program product comprising program code means designed to perform the method. Such a computer program product can be executed on a computer, such as a personal computer or a laptop computer or a smart phone or a (3D) camera or some other computing device.

A third aspect of the invention provides a system implementing the method according to the invention. The system comprises: a first interface for acquiring user interest information (e.g. a connection to Facebook user profiles); a processing unit, capable of determining a lighting device design related variable based on the acquired user interest information (e.g. a rule based set of instructions); and further capable of providing a lighting device design based on the lighting device design related variable (e.g. capable of selecting a lighting device design from an electronic catalogue of lighting device designs); and a second interface for displaying an image of the provided lighting device design (e.g. a connection to an online advertisement exchange service that enables an advertisement, comprising the image of the provided lighting device design, to be displayed on a website the user is visiting).

All of the above can be implemented in a variety of ways, some of which are described in the detailed description of the figures.

These and other aspects of the invention will be apparent from and elucidated with reference to the embodiments described hereinafter. Appreciate, however, that these embodiments may not be construed as limiting the scope of protection for the invention. They may be employed individually as well as in combination.

DETAILED DESCRIPTION OF THE FIGURES

Figure 1:
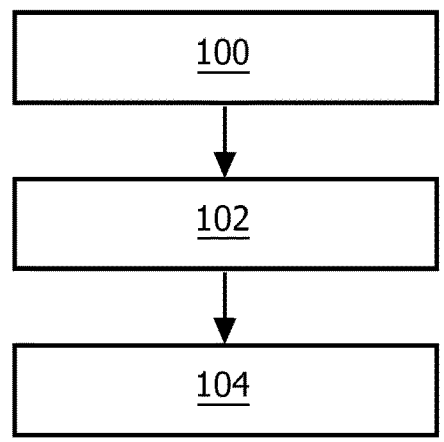
FIG. 1 shows schematically and exemplarily a method for assisting a user in selecting a lighting device design based on displaying an image comprising the lighting device design applied to a scene.

FIG. 1 shows a method for assisting a user in selecting a lighting device design by displaying an image comprising a selected lighting device design applied to a selected scene. The method comprises the steps of: selecting a scene by a user 100; selecting a lighting device design by the user 102; and displaying an image comprising the selected lighting device design applied to the selected scene 104. Selecting a scene 100 is based on selecting a room from a set of room types or based on the user providing an image. Selecting a room type from a set of room types comprises selecting a word or an image representing a room type from a set of words or images representing a set of room types. Room types comprise a bathroom, a living room, a master bedroom, a kitchen, a hallway, a study, etc. A room type comprises variations of a similar room, such as a modern living room, a classical living room, a minimalist living room, a large living room, a small living room, etc. When the user provides an image to create a scene, this image comprises a photograph which the user has taken or is taking as part of the scene selection step. Alternatively the user provides a video recording, a sketch or any other graphical representation of, as an example, the room in which a lighting device, purchased based on the selected lighting device design, will be installed.

Selecting a lighting device design 102 is based on the user selecting a light source, a lighting device design type or a combination of these. Examples of light sources a user can choose from comprise incandescent, halogen, LED, fluorescent or discharge lamps, etc. Each light source can have a specific lighting effect. These light sources have static features such as wattage, maximum light intensity, color temperature, etc. An example of such a light source is a 60 W, frosted, incandescent light bulb (e.g. 'Philips 60 Watt Incandescent Director' light bulb). Alternatively, these light sources have variable features, such as color temperature, color, ability to be dimmed, etc. An example of such a light source is a LED retrofit light bulb that is dimmable and changes in color temperature from warm white to cool white (e.g. 'Philips MASTER LEDbulb DimTone 8-40 W' light bulb). Examples of lighting device design types a user can choose from comprise a ceiling lamp, table lamp, desk lamp, spot light, floor light, etc. An example of such a lighting device design type could be a hanging ceiling lamp (e.g. 'Philips DayWave BPS800'). Optionally these selection steps are combined, whereby the user selects a lighting device design type and a default light source is chosen automatically. The user then has the option to select a light source other than the default. In another example, the light sources a user can choose from are limited to those that are compatible with the chosen lighting device design type. If otherwise a light source is selected that is not compatible with the selected lighting device design type, the user receives a warning message to select a different light source from those light sources that are compatible with the chosen lighting device design type. Alternatively the user is forced to change the selected light source to one that is compatible with the chosen lighting device design type. Preferably, the selection of a lighting device design type is limited to those lighting device design types that are compatible with the scene selected. As an example, selecting a bathroom as the scene limits the lighting device design types that are selectable to those that are safe to use in a bathroom (e.g. lighting device design types rated IP6 for being waterproof).

As an example, the user selects more than one lighting device design, such as a ceiling lamp and a table lamp. Both lighting device designs are then displayed in the image comprising the selected lighting device designs applied to the selected scene. Preferably, the lighting device designs can be positioned only in specific positions in the scene. The user is then, for example, provided with a visual clue (e.g. highlighting a position in the displayed image), to make apparent that a lighting device design can be included at that position in the scene. This is advantageous as the user is assisted in determining where a selected lighting device design can be placed and where additional lighting device designs can be placed in a scene. Also, the user can then 'drag and drop' a lighting device design in the vicinity of such a position in the scene whereby the lighting device design is then placed at the specific position where it fits in the scene. As an example, the visual clue includes a suggestion, such as the suggestion to select a desk lamp with a cool white LED light bulb to be placed on a desk that is present in the scene. In this example, the suggestion is based on the task a user performs at that position in the scene (i.e. the user might appreciate cool white light for reading documents while seated at the desk). Other examples of suggestions provided to the user comprise suggestions based on the mood, atmosphere or ambience a user wants to create in the scene. Such information can be deduced by analyzing the scene, for example, by analyzing the dominance of colors and patterns (e.g. dominant presence of white in a room with little clutter can indicate a minimalist style). The analysis can be based on various other elements, such as scene's geometrical data or the presence in the scene of a material, a shape or an object.

Suggestions can also be based on selections the user has made, for example, a suggestion can be provided to select a lighting device design based on the user's previous selection. The various selections a user makes can be used to create a user profile. As an example, if the user selects multiple lighting device designs comprising three light sources, a suggestion can be made for other lighting device designs of such kind. The profile can also include information on how long a user has viewed a scene with a first lighting device design compared to a second lighting device design (e.g. to determine which lighting device design is more to the user's liking). By requesting user feedback, such as through requesting the user to rate lighting device designs, user preferences can be taken into account directly. Lighting device designs that share more similarities with highly rated lighting device designs can be suggested first.

A user profile can also comprise data from external sources, such as a user's musical preferences based on his/her online playlist (e.g. through the 'last.fm' website). As an example, a strict preference for music from the 1960's can lead to a suggestion for a retro lighting device design. Next to suggestions based on a user's profile, suggestions can also be based on profiles of other users, for example by analyzing a user's social network (e.g. a user's Facebook social graph). If multiple friends of a user have selected a specific lighting device design (e.g. a light therapy device) this lighting device design can be suggested to the user. Recommendations from other users, lighting designers, (famous) artists, etc. can also be the basis for suggesting to the user to select a scene, a lighting device design or a value for a lighting property of a lighting device design.

The image comprising the selected lighting device design applied to the selected scene 104 is displayed to show the user what the selected lighting device design looks like in the selected scene. The image is created before or after the user has selected the scene and lighting device design. Creating it beforehand requires a multitude of combinations of scenes, lighting device designs and lighting properties to be considered. Creating it after the scene and lighting device design selection has been made by the user, introduces a delay between the user selection and displaying the image. The image can be created based on blending an image representing the scene, an image representing the lighting device design and an image representing a lighting effect based on a lighting property of the lighting device. This limits the number of images that have to be created beforehand and at the same time limits the delay between user selection and displaying the image.

As a further example, when an image is presented to the user any of the following changes can be made: changes to the selection of the scene, changes to the selection of the lighting device design and changes to the setting of the properties of the lighting device design. These changes are made by the user or are suggested to the user. As an example, one or more element is fixed, such as keeping the scene, but changing the lighting device design and the lighting properties; or changing the scene but keeping the lighting device design. A change to one element can result in changes to another element, for example, when there are dependencies. When changing the scene from a study to a living room, for example, a ceiling lamp remains while a desk lamp is removed from the scene. As another example, changing the lighting device design from a lighting device design type that hangs from the ceiling to a lighting device design type comprising a spot light built into the ceiling changes the beam angle. Changes can result in warning messages, further suggestions or the user being forced to make changes to the selected scene, lighting device design, or lighting properties of the lighting device design or a combination thereof.

Figure 2:
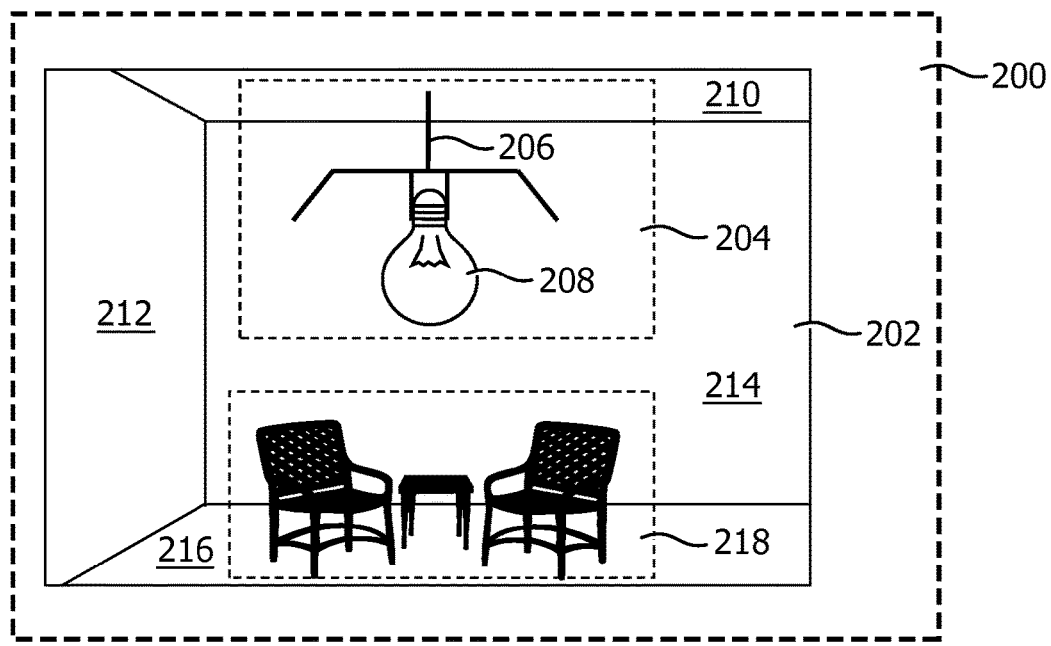
FIG. 2 shows schematically and exemplarily a living room comprising a lighting device design.

FIG. 2 shows an example of an image of a lighting device design applied to a scene. The image shows a living room 200, comprising the room itself 202 and a lighting device design 204 present in this room. The lighting device design 204 comprises a fixture 206 and a light source 208. As an example, the fixture 206 shown is a hanging lamp and the light source 208 shown is an incandescent light bulb. In this exemplary figure, the room 202 comprises a ceiling 210, left wall 212, rear wall 214 and floor 216. The fixture 206 is shown to be attached to the ceiling 210 and located above the furniture 218 that is present in the room 202. This living room 200 looks familiar to the user as it, for example, resembles in one or more ways a room in the user's own house. The user views the lighting device design 204 of his/her choosing in the context of this room 202.

Figure 3:
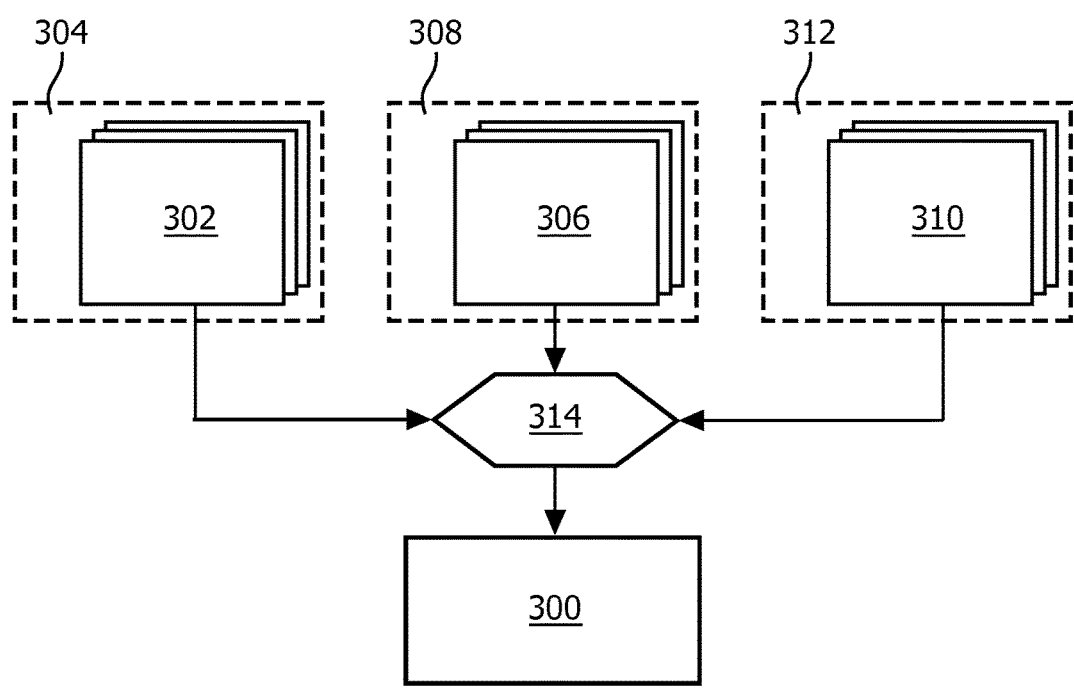
FIG. 3 shows schematically an embodiment of rendering an image comprising a lighting device design and a lighting effect applied to a scene.

FIG. 3 shows an example of how to create an image 300 comprising the selected lighting device design applied to the selected scene. For each scene there is an image representing that scene 302. By means of the user selecting a scene, an image representing the scene 302 from a set of such images 304 is selected. By means of the user selecting a lighting device design, an image representing the lighting device design 306 from a set of such images 308 is selected. By means of the user selecting a value from a range of values for a lighting property, an image representing a lighting effect based on a lighting property of the lighting device design 310 is selected from a set of such images 312. Alternatively, an image representing a lighting effect based on a lighting property of the lighting device design is selected by other means, for example, it is selected based on the selected lighting device design, the selected scene, a default value or a combination of any of these.

As a further example, the image comprising the selected lighting device design applied to the selected scene can be rendered by taking: a first image representing the scene, a second image representing the lighting device design and a third image representing a lighting effect based on a lighting property of the lighting device design. Eq. 1 is presented here to better understand this.

$$VR = VS_{(i)} + VL_{(j)} + VE_{(k)} \qquad \text{Eq. 1,}$$

where:
VR is an image comprising the selected lighting device design applied to the selected scene,
VS is an image representing the scene,
VL is an image representing the lighting device design,
VE is an image representing a lighting effect based on a lighting property of the lighting device design,
i, j and k refer to the respective images representing the selections the user has made; and
the operator (+) represents the application of a function to any of the images.

Rendering the image of the selected lighting device design applied to the selected scene using this method, requires only a repository with a set of images representing the scenes from which the user can make his/her selection, a set of images representing the lighting device designs from which the user can make his/her selection and a set of images representing a lighting effect based on a lighting property of the lighting device designs. It is not required to have a repository containing images of each of the many combinations of these scenes, lighting device designs and lighting properties of these lighting device designs. For the avoidance of doubt, the method can be implemented in such a way that images from these sets of images need not have the same size, dimensions, dynamic range, format, etc.

Applying 314 the selected lighting device design to the selected scene, can comprise the application of a blending algorithm. As an example, each pixel from the pixel matrices that are the image representing the scene and the image representing the lighting device design is blended by means of applying a normal blend mode. This results in the image representing the lighting device design being applied as a top layer to the image representing the scene. The image representing a lighting property of the lighting device related to the lighting device design can then be blended with the image resulting from the previous blending step. As an example, a linear dodge blend mode is applied in this step. This is an application of a sum function to the pixel values of the images. As a result those areas of the scene that are affected by the light emitted by the lighting device related to the lighting device design become brighter. There are various blend modes (e.g. multiply, overlay, lighten only) and combinations of blend modes that can be used to combine the images in order to create an image comprising the selected lighting device design applied to the selected scene. Although in these examples the lighting effect related to the lighting properties of the selected lighting device design are applied to the scene as well, this is optional. For example, to lower the amount of processing power needed (e.g. to speed up the rendering of the image), the lighting effect can be omitted from the image.

In FIG. 3, three different images 302, 306, 310 are selected. However, implementations are possible with either more than or less than three images. As an example, the lighting device design and the scene are represented by a single image, the lighting device design and the properties of the lighting device design are represented by a single image, a lighting effect based on the lighting properties of the lighting device design or the lighting device design itself are represented in multiple images (e.g. multiple images, each representing a specific component of a lighting device design). Also, various steps can be introduced in order to render the image based on, for example, images having different sizes, dimensions, dynamic ranges, formats, etc. Given the example of images having different sizes, a step can be introduced that resizes images prior to images being combined.

As an example, referring to Eq. 1, the user having selected the large modern living room ('LMLR') as the scene; a first ('L1') and a second ('L2') lighting device design as lighting device designs; and the default lighting properties of the lighting device designs ('DP1' and 'DP2' respectively); the equation is written as follows: $VR = VS_{(LMLR)} + VL_{(L1)} + VE_{(DP1)} + VL_{(L2)} + VE_{(DP2)}$.

Figure 4:
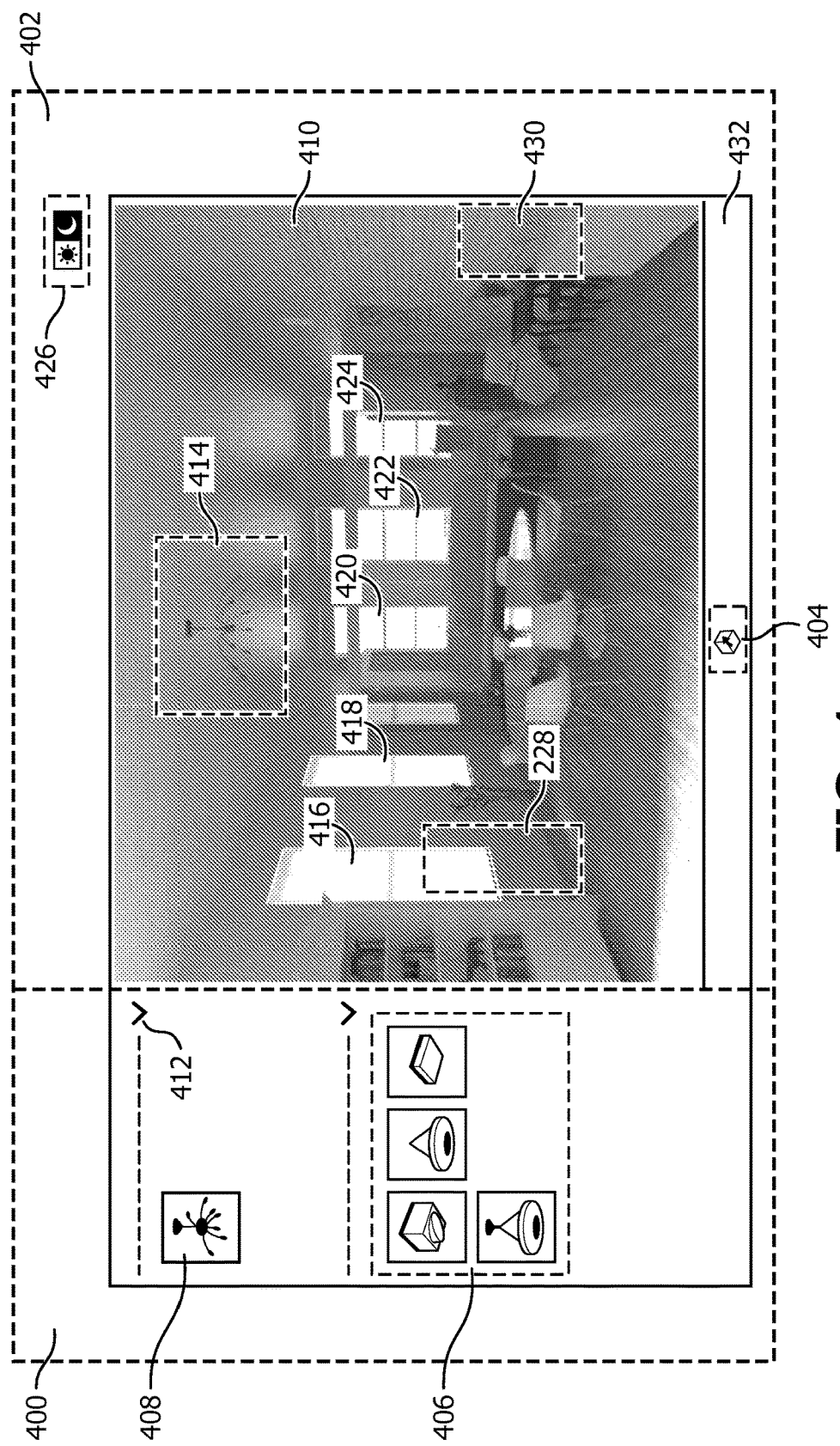
FIG. 4 shows schematically an embodiment of a graphical user interface for assisting a user in selecting a lighting device design.

FIG. 4 shows an example of a graphical user interface for assisting a user in selecting a lighting device design. This example of a graphical user interface comprises two main elements: a first element 400 comprising a lighting device design selection interface and a second element 402 comprising both the image comprising the selected lighting device design applied to the selected scene, as well as a scene selection interface.

The graphical user interface has means for selecting a scene 404 and selecting a lighting device design 406. The currently selected lighting device design is shown 408 as well as the image 410 comprising the selected lighting device design applied to the selected scene. Additional options in the user interface are available through a pull down menu 412. These options can comprise finding similar lighting device designs (e.g. lighting device designs of the same product series), removing the lighting device design from the image 410, replacing the lighting device design in the image 410, etc. The pull down menu 412 can also be arranged to allow the user to scroll through all lighting device designs from a selection of available lighting device designs, to search for a specific lighting device design, to change the interface (e.g. show smaller thumbnails of the lighting device designs), etc. The lighting device designs from which the user can make a selection 406 comprise any number of options and features, for example, the images are complemented with other information comprising a name, description, category or rating (e.g. check mark for compatibility, star rating for popularity, eco symbol for environmental friendliness) where applicable. Selections made by the user are used to make further suggestions, create favorites, track history, etc., for example, by storing user made selections in a user profile.

Any changes to the selected lighting device design 408 are shown in the image 410. In an embodiment of the graphical user interface, a value, from a range of values, of a lighting property of the selected lighting device design is selected and the related lighting effect is included in the image 410. The lighting properties are set, for example, based on the scene selected, the position of the lighting device design in the scene, the type of lighting device design selected, etc. Lighting properties comprise the direction of light emitted, intensity of light emitted, color of light emitted and position of the lighting device design. These properties are selectable from a range (e.g. selecting a value of 3000 Kelvin for the color temperature from a range of 1000 Kelvin-5000 Kelvin). Alternatively, a subset of a range is selected which has as a result that the image changes over time. An example of such a selection of a subset of a range is to select as a lighting effect to color cycle. Similarly, if a dim level is changed from, for example, 100% (i.e. not dimmed) to 40% this can be shown in the image 410 as a gradual change. Lighting properties are set to a default value which, as an example, is based on the selected scene. The scene can additionally include outside light sources, such as daylight entering the scene through a window 416, 418, 420, 422, 424. Such a light source also has lighting properties (e.g. based on the season or time of day) and in this example one of the lighting properties is set by the user through a day/night switch 426. Similarly, the dim factor of a lighting device design is set by the user when the user, through an input device such as a mouse or touchscreen, approaches the area close to the lighting device design 414 and a slider appears allowing the user to set this dim factor. Other such 'hot zones' are included in the graphical user interface, for example, to show where additional lighting device designs can be placed 428, 430. Feedback is provided to the user to encourage interaction with the graphical user interface, for example, through providing hints in the bar 432. This is just one example of a graphical user interface and many other implementations are possible.

Figure 5:
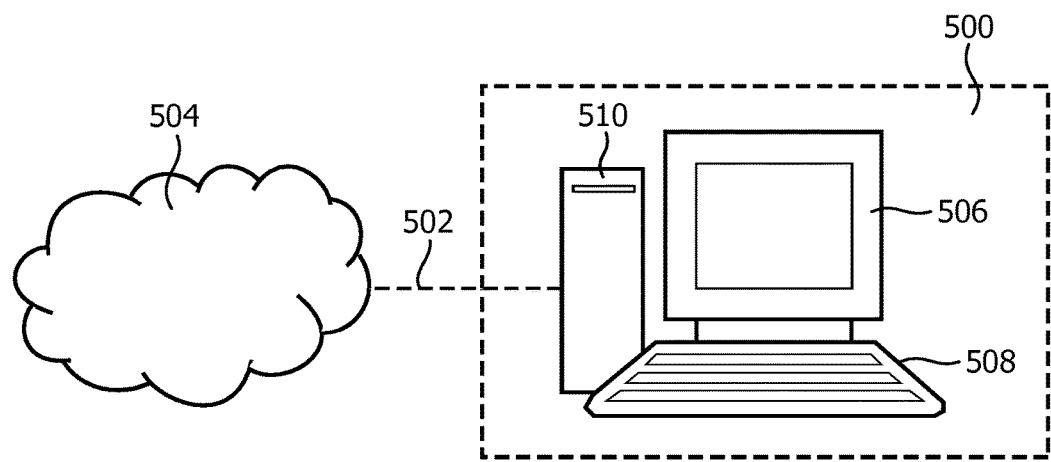
FIG. 5 shows schematically and exemplarily a system implementing a method for assisting a user in selecting a lighting device design.

FIG. 5 shows an example of a system implementing a method for assisting a user in selecting a lighting device design. This system comprises a personal computer 500 with an internet connection 502 to access a cloud based storage unit 504 such as a web enabled server. In other embodiments of the system according to the invention, other devices, such as a PDA, portable computer, tablet, kiosk, etc. are used instead of a personal computer. The storage unit in these other embodiments can be implemented as, for example, a local hard disk drive, an optical drive with an optical medium, etc.

The personal computer has a display capable of displaying a graphical user interface 506. It captures user input through a keyboard 508, a mouse, trackball, touchpad, touchscreen, or another human machine interface. The processing unit 510 is arranged to process the user selecting, for example, a scene or a lighting device design; and it is further arranged to render an image, such as an image comprising the selected lighting device design applied to the selected scene. The system includes a storage unit 504, accessible to the processing unit 510, capable of storing any of the following: data related to a scene, data related to a lighting device design, data related to user input, data related to a graphical user interface. An example of data related to a lighting device design in this example, is a set of images representing the lighting device designs from which a user can choose; and a set of images related to lighting properties or lighting effects of these lighting device designs. The architecture of the system is based on requirements such as speed of rendering an image, number of scenes and lighting device designs a user can choose from, etc.

Figure 6:
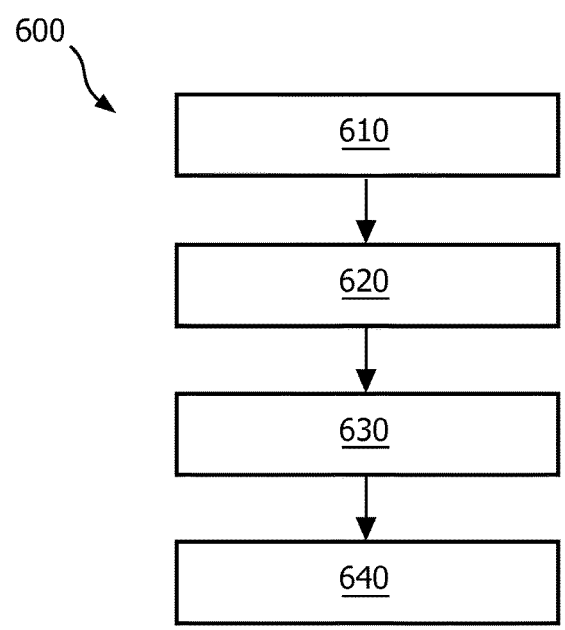
FIG. 6 shows schematically and exemplarily a method for assisting a user in selecting a lighting device design based on first selecting a lighting effect.

FIG. 6 shows a method for assisting a user in selecting a lighting device design by first selecting a lighting effect. The method 600 comprises four steps: In a first step 610 the user selects a scene and in a second step 620 the user selects a lighting effect. These steps can be performed in reverse order. In a third step 630 an image is displayed comprising the selected lighting effect applied to the selected scene. This image can additionally comprise a lighting device design; however an especially beneficial implementation of the method is where no lighting device design is shown in the image. The user can then select a lighting effect without taking the lighting device design into consideration. This can assist a user in making a better selection as the choice he/she makes only involves determining whether the selected lighting effect is appreciated in the selected scene.

In execution of this method, the user is first presented a lighting effect as part of a scene (e.g. broad beam down light from the center of the ceiling applied to a living room), allowing the user to choose the lighting effect prior to choosing the lighting device design. In a fourth step 640 the user selects or designs the lighting device design. Selecting a lighting device design can comprise selecting a lighting device design from a set of lighting device designs (e.g. from an electronic catalogue of lighting device designs). Designing a lighting device design can comprise, for example, the user using a computer aided design application to design a lighting device design, the user selecting one or more lighting device design modules (e.g. selecting an optical module, a light source module and a fixture module) or a combination of these (e.g. the user selecting an optical module and a light source module and subsequently designing the fixture or part of the fixture such as the lampshade).

The lighting device design that the user selects or designs is arranged to provide a lighting effect similar or equal to the selected lighting effect. As a first example, the user selects a broad beam down light lighting effect with a beam width of 23 degrees. The user can then select a lighting device design, through the user interface, from a set of down light lighting device designs that are arranged to provide a 23 degree beam width. This set of lighting device designs can be a subset of the lighting device designs included in an electronic catalogue of such lighting device designs. In case there are no or very few lighting device designs providing this lighting effect, the user can be allowed to select down lights with a beam of 20 to 26 degrees, for example. Determining which lighting device designs are arranged to provide a lighting effect similar to the selected lighting effect, can be based on, for example, predetermined ranges (e.g. max. 3 degree variation of beam angle, max. 100 degree Kelvin color difference) or variable ranges that allow a user to always be presented at least 10 lighting device designs to choose from or at most 50 lighting device designs to choose from.

In an additional step (not shown), an image can be displayed comprising the selected lighting device design applied to the selected scene. This provides as an additional benefit, visual feedback to the user related to the selections he/she has made. Alternatively, an image can be displayed comprising the selected lighting device design and the selected lighting effect applied to the selected scene. This allows the user to even better determine whether he/she is satisfied with the selections he/she has made. The method can be implemented in an iterative manner, providing the user an opportunity to change selections made earlier and, for example, provide real time updates to the displayed image. The user can then try several combinations (e.g. a first lighting device design in a first scene and a second lighting device design in this same first scene) to determine, for example, which lighting device design he/she wants to purchase.

Figure 7:
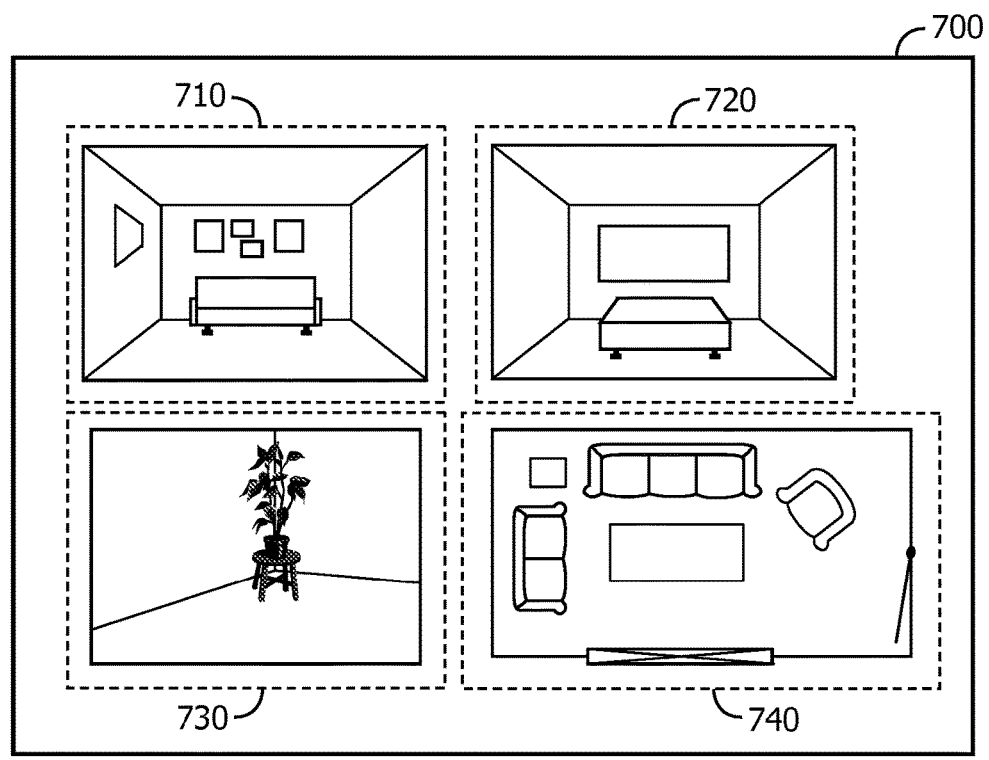
FIG. 7 shows schematically and exemplarily a graphical user interface for selecting a scene by a user.

FIG. 7 shows an example of a graphical user interface 700 for selecting a scene. In this example a user is presented a number of scenes to choose from through, in this example, four images of a scene 710, 720, 730, 740. Two are images 710, 720 of respectively a living room and a bedroom drawn in perspective to provide the user with a sense of depth. The third image 730 is simply a corner of a room, allowing the user to select a detail (e.g. this could be the corner of one of the other rooms the user can select as a scene). The fourth image 740 is a top view of a living room. In this example, the user interface can be used to select between various scenes as well as different parts and views of a scene. The image of the scene shown through the user interface 700, does not necessarily have to be the same as the image of the selected scene that is referred to in "an image comprising the selected lighting effect applied to the selected scene". The user interface 700 can, for example, show a thumbnail image of a larger image of the scene, a still image of a moving image of the scene, or simply provide a description (in words) of the scene, etc.

Figure 8:
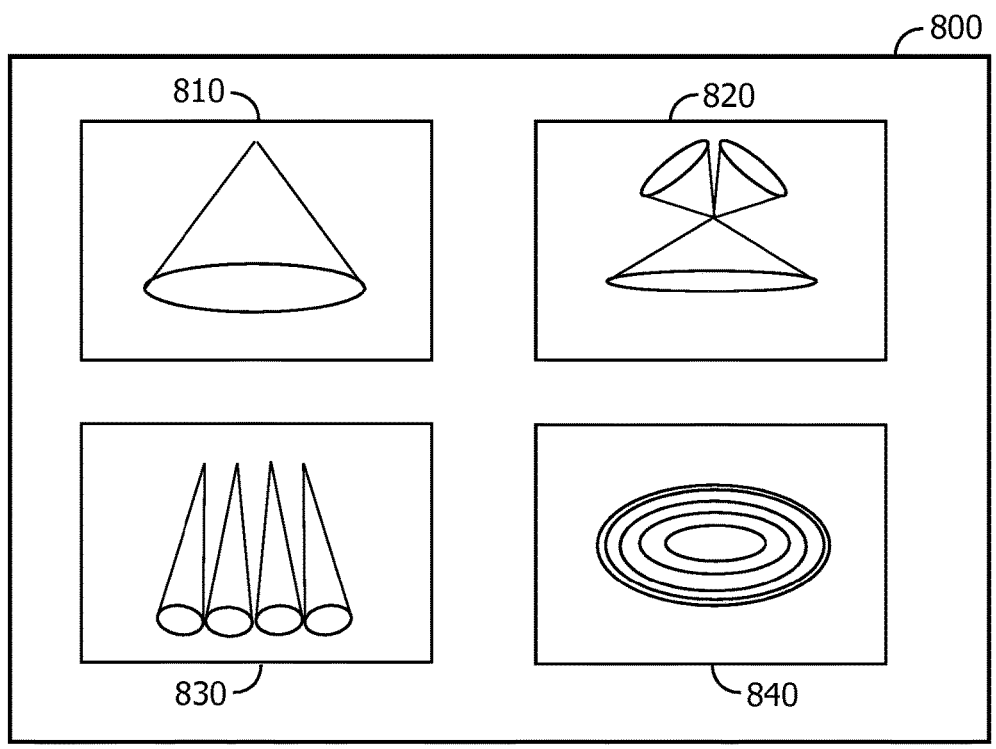
FIG. 8 shows schematically and exemplarily a graphical user interface for selecting a lighting effect by a user.

FIG. 8 shows an example of a graphical user interface 800 for selecting a lighting effect. In this example a user is presented a number of lighting effects to choose from through, in this example, four images of a lighting effect 810, 820, 830, 840. Three images 810, 820, 830 show the number, direction and width of light beams drawn in perspective. The fourth image 840 shows a top down view of the lighting effect on a flat surface.

In this example, each image shows a light distribution as lighting effect. The user interface could guide a user through several steps, in order for him/her to select different lighting properties, such as light distribution, light color, light intensity, etc. In a single step multiple lighting properties could be selected at once, for example when the user selects an image representing as lighting effect both a light intensity and color.

Figure 9:
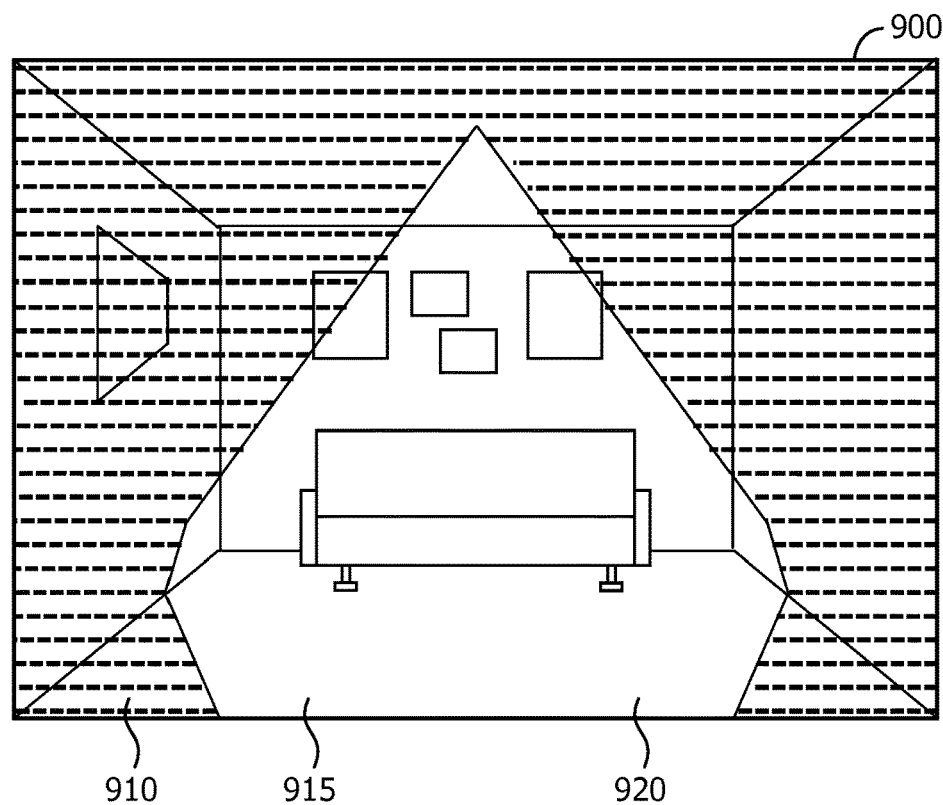
FIG. 9 shows schematically and exemplarily an image comprising a lighting effect applied to a scene.

FIG. 9 shows an example of an image 900 comprising the selected lighting effect applied to the selected scene. In this example, the living room scene has been selected by the user (this scene was selectable through image 710 as shown in FIG. 7). To this selected scene the selected lighting effect has been applied (this lighting effect was selectable through image 810 as shown in FIG. 8). The result, in this example, is an image 900 that shows a dark, shaded area 910 and a light, unshaded area 915 in the living room scene 920. In various embodiments the image can be an animation, a rotatable and/or zoomable image or interactive image (e.g. light sources can be switched on/off, or dimmed).

Figure 10:
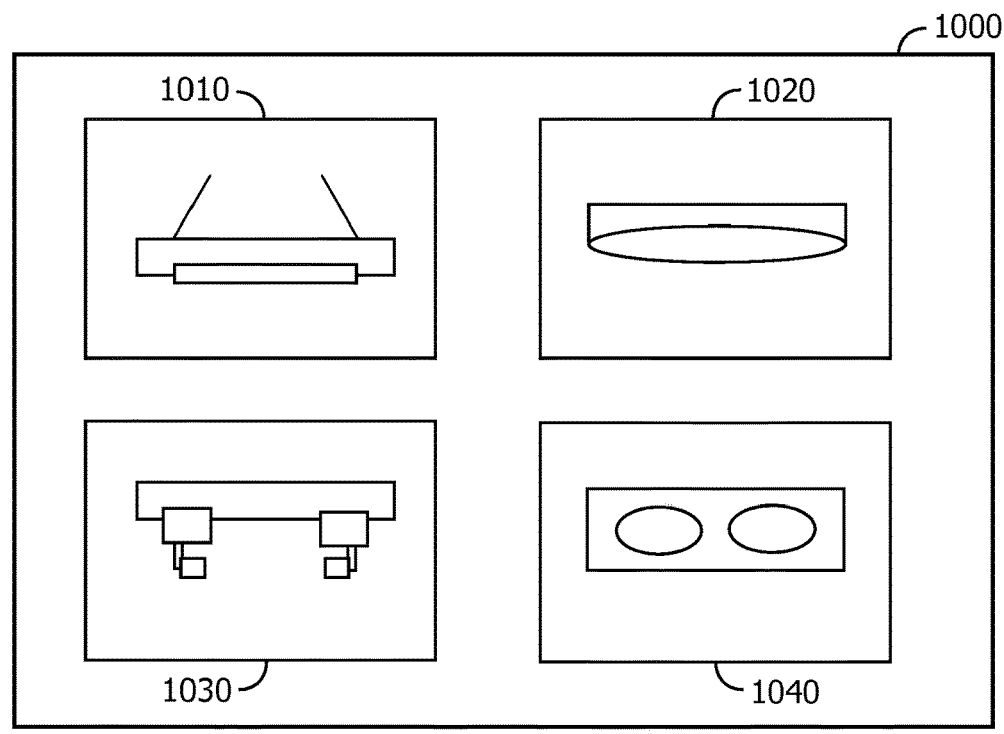
FIG. 10 shows schematically and exemplarily a graphical user interface for selecting a lighting device design by a user.

FIG. 10 shows an example of a graphical user interface 1000 for selecting a lighting device design. In this example a user is presented a number of lighting device designs to choose from through four images of lighting device designs 1010, 1020, 1030, 1040. Three images 1010, 1020, 1030 show a side view of a lighting device design. The fourth image 1040 shows a bottom up view of a lighting device design. In various embodiments of the user interface, the selected lighting effect can be applied to the image of the lighting device design, the images of the lighting device designs can show animations of different perspectives of the lighting device designs, etc. The user can be guided through selecting a lighting device design by making multiple choices in multiple steps, such as first choosing a material (e.g. copper, aluminum) or a size (e.g. large, 20 cm wide) and then being presented lighting device designs to choose from.

Figure 11:
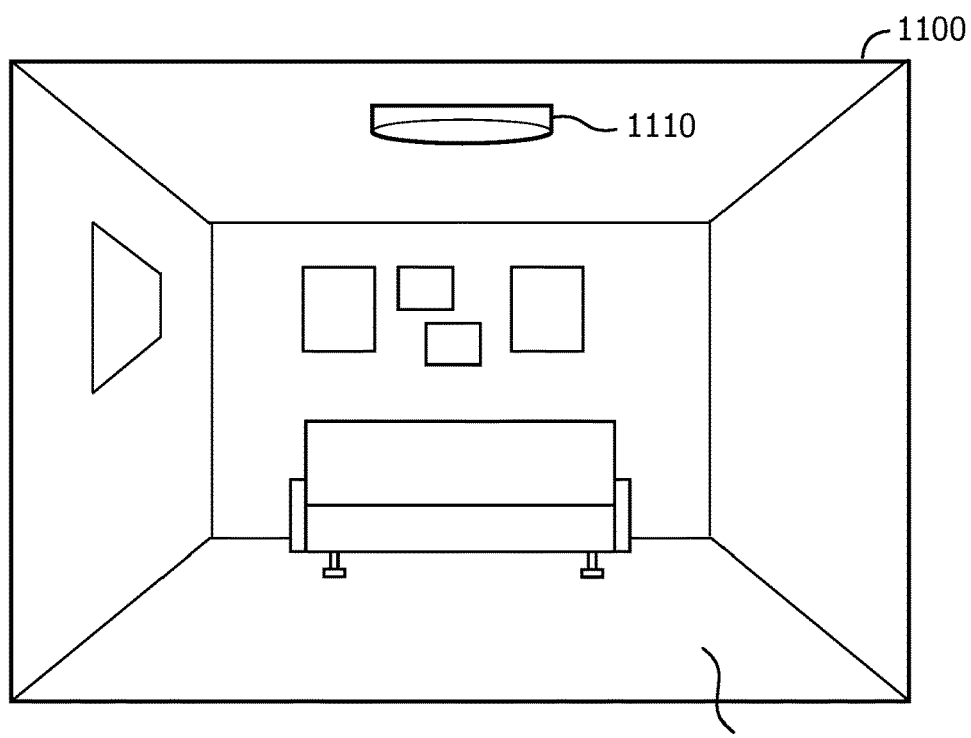
FIG. 11 shows schematically and exemplarily an image comprising a lighting device design applied to a scene.

FIG. 11 shows an example of an image 1100 comprising the selected lighting device design (this lighting device design was selectable through image 1020 in FIG. 10) applied to the living room scene (this scene was selectable through image 710 as shown in FIG. 7).

Figure 12:
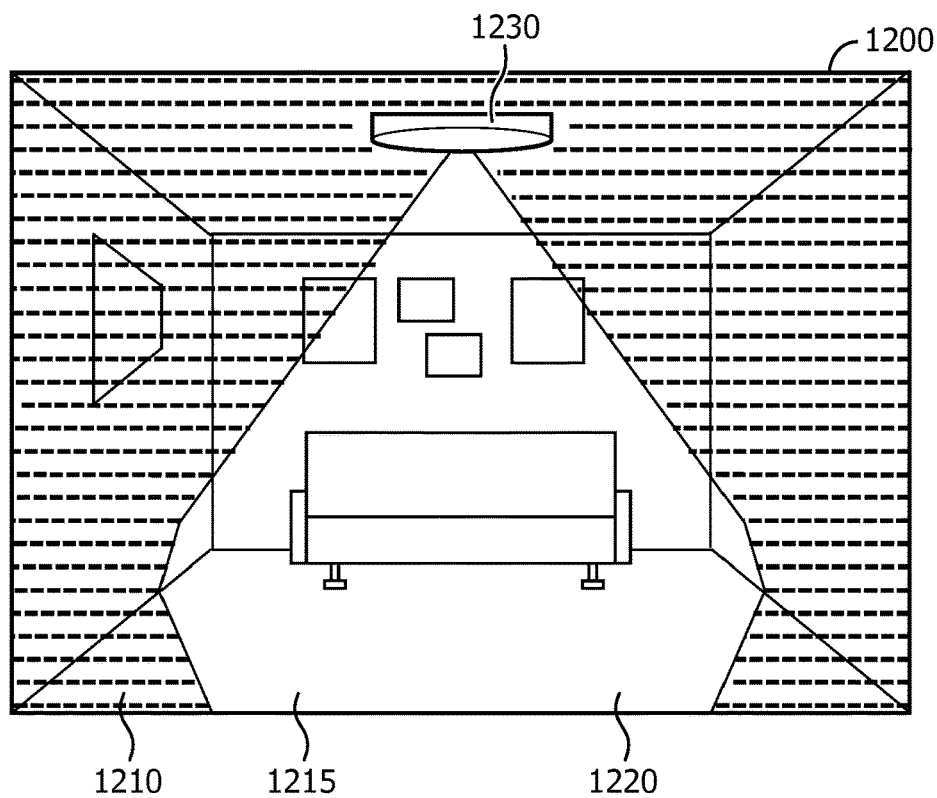
FIG. 12 shows schematically and exemplarily an image comprising a lighting device design and a lighting effect applied to a scene.

FIG. 12 shows an example of an image 1200 comprising the selected lighting device design and the selected lighting effect applied to the selected scene. In this example, the living room scene has been selected by the user (this scene was selectable through image 710 as shown in FIG. 7). To this selected scene the selected lighting device design (this lighting device design was selectable through image 1020 in FIG. 10) and the selected lighting effect have been applied (this lighting effect was selectable through image 810 as shown in FIG. 8). The result, in this example, is an image 1200 that shows a dark, shaded area 1210 and a light, unshaded area 1215 in the living room scene 1220 with the lighting effect seemingly originating from the lighting device related to the selected lighting device design as displayed in the image 1230.

Figure 13:
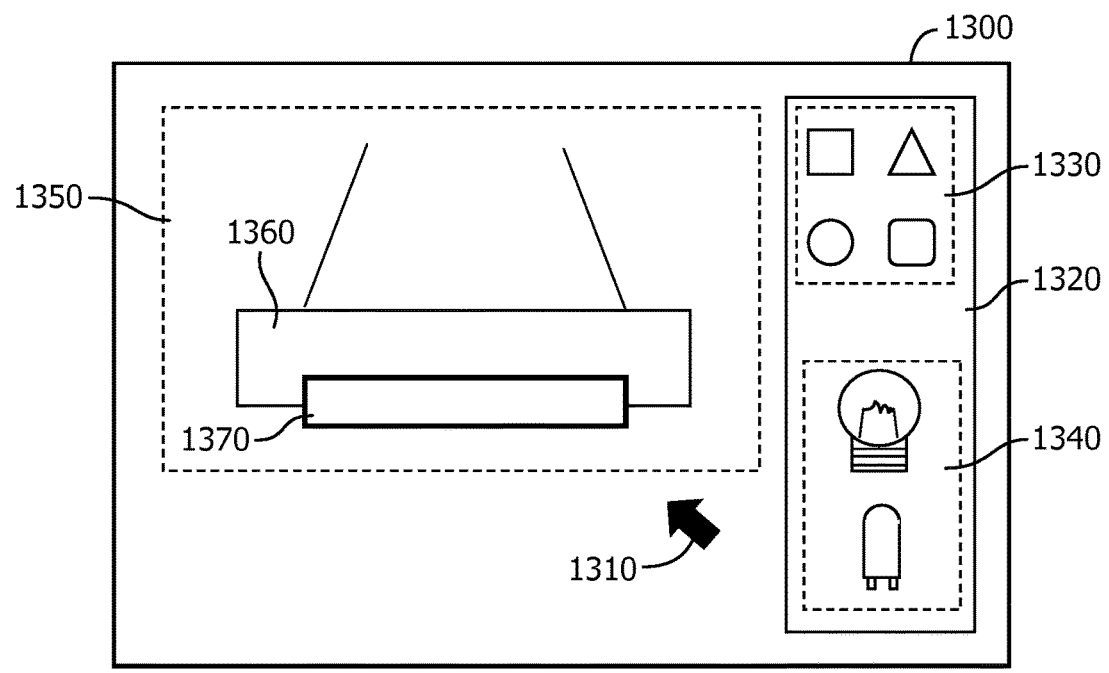
FIG. 13 shows schematically and exemplarily a graphical user interface for designing a lighting device design by a user.

FIG. 13 shows an example of a graphical user interface 1300 for designing a lighting device design. The graphical user interface provides a cursor 1310 which the user can control using, for example, a mouse (not shown) and allows the user to make selections, execute drag-and-drop and other operations within the graphical user interface 1300. The graphical user interface 1300 comprises a menu area 1320 with a first section 1330 arranged for a user to select various shapes and a second section 1330 for a user to select various light sources. Operations performed by the user in the graphical user interface lead to changes in the lighting device design preview 1350. In this example, a basic rectangular shape 1360 has been chosen as fixture for the lighting device design. The user can instead select a different basic shape through the first section 1330 of the menu area

1320. As a further example, the lighting device design comprises an optics module 1370 which, as indicated in the preview 1350 by the highlighted shape of this optics module 1370, cannot be changed by the user as this optics module 1370 determines the lighting effect produced by the lighting device according to the lighting device design. The lighting effect, in this example, has been previously selected by the user and the user is therefore guided by the user interface to design a lighting device design arranged to provide a lighting effect similar or equal to the selected lighting effect.

This is a very basic example of a graphical user interface for designing a lighting device design. Alternatively or in addition, more advanced computer aided design applications can be used. Such a computer aided design application can be provided directly through the graphical user interface 1300 or through a separate application (e.g. offline) in conjunction with the user providing this design (e.g. in a DWG or DXF format) through the user interface 1300 (e.g. through uploading the file).

Figure 14:
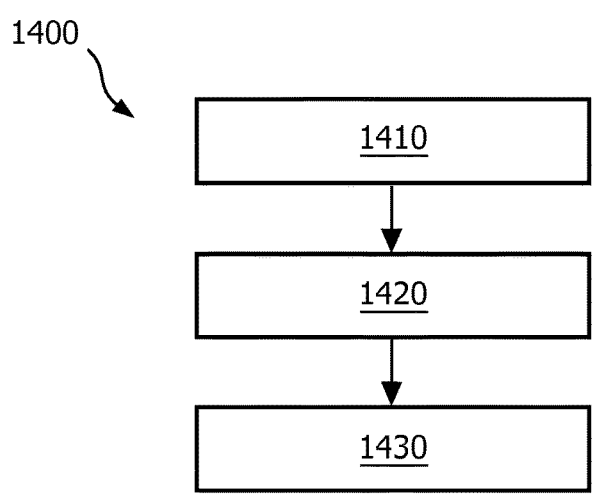
FIG. 14 shows schematically and exemplarily a method for providing a lighting device design based on any one of a model of a lighting device design, an image of a lighting device design or an image of a scene comprising a lighting device design.

FIG. 14 shows a method 1400 for assisting a user in selecting a lighting device design through providing a lighting device design based on a model or image of (a scene comprising) a lighting device design. The method 1400 comprises a first step 1410 of receiving, through a graphical user interface, any one of: a model of a lighting device design, an image of a lighting device design, or an image of a scene comprising a lighting device design. As an example, a user can upload a file comprising the model or image, or the user can design the lighting device design through the graphical user interface if the graphical user interface comprises a computer aided design application. In a second step 1420 a lighting device design related variable is determined based on an analysis of respectively the model of a lighting device design, the image of a lighting device design, or the image of a scene comprising a lighting device design. As a first example, analysis of the model of the lighting device design can determine, for example, the size, shape and potentially also color and materials of the lighting device design. As a second example, image analysis of the image of the lighting device design can determine shape, color, materials and potentially also lighting properties (e.g. brightness, light distribution) of the lighting device design. As a third example, image analysis of the scene comprising the lighting device design can determine the same variables as the image analysis of the lighting device design and alternatively or in addition determine the dominant style in the room, the most contrasting color in the room, a position where the lighting device design can be placed, etc. Each of these analyses can determine a lighting device design related variable, such as the type of lighting device design (e.g. ceiling lamp) or the color of the lamp hood (e.g. red). Multiple analyses can be combined to determine, for example, more complex variables such as style (e.g. classical, modern) or enhance the analysis capabilities, for example, upon detecting a dominant presence of the color baby blue, analyze the image for the presence of toys or cartoon characters (e.g. to suggest a lighting device in the shape of a specific cartoon character). In a third step 1430 a lighting device design is selected or generated based on the lighting device design related variable. Selecting the lighting device design can be based on selecting a lighting device design from, for example, an electronic catalogue of lighting device designs, based on which lighting device design has most lighting device design variables in common with the lighting device design in the image provided by the user. Generating a lighting device design can be based on applying one or more of the determined lighting device design variables to a base lighting device design (e.g. adapting the base lighting device design, such as a standing lamp, to the lighting device design type, such as a desk lamp, based on the image analysis). This can be done automatically by the system, or the determined lighting device design variables can be offered as (more) prominent options in the graphical user interface thereby enabling a user to more easily adjust a lighting device design by offering easy selection of the determined lighting device design variables.

Figure 15:
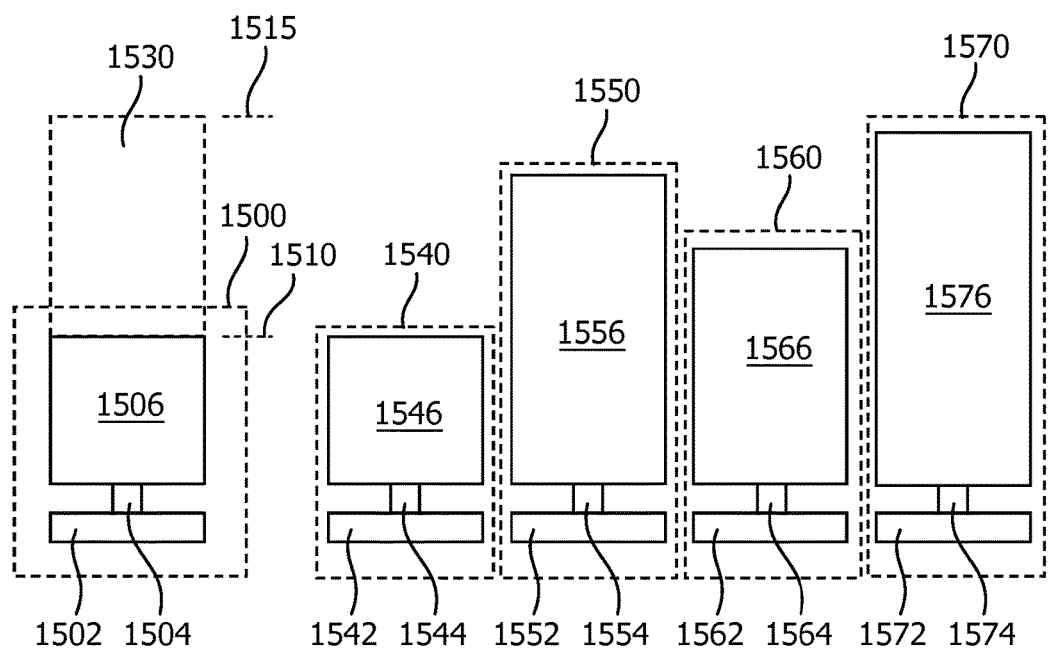
FIG. 15 shows schematically and exemplarily generating (a family of) lighting device designs based on randomization of lamp hood length.
Figure 16:
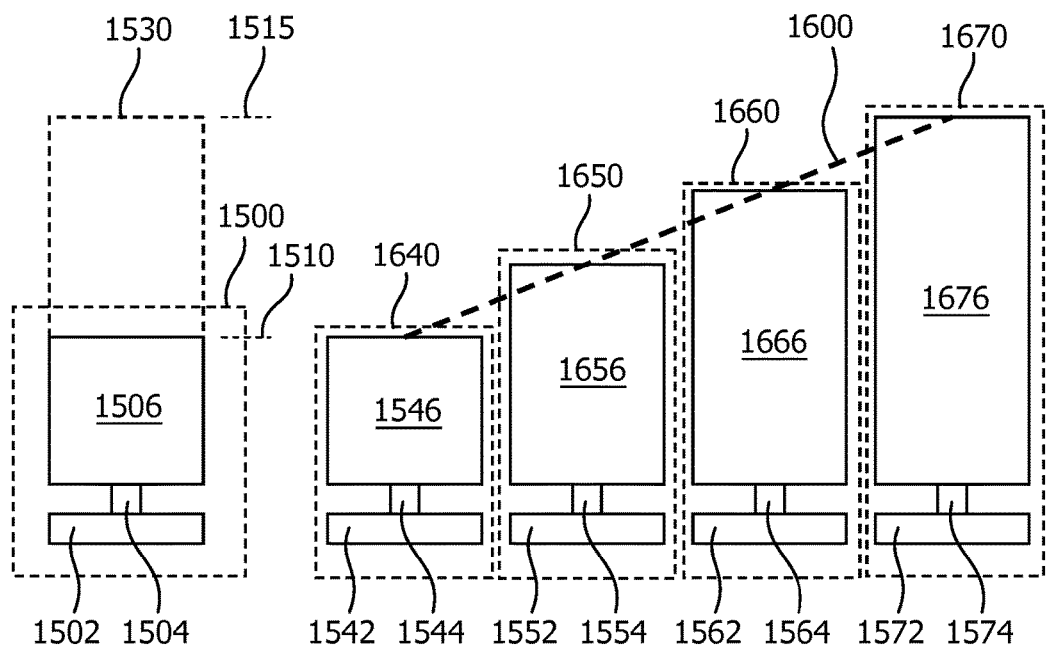
FIG. 16 shows schematically and exemplarily generating (a family of) lighting device designs based on incremental increase in lamp hood length.
Figure 17:
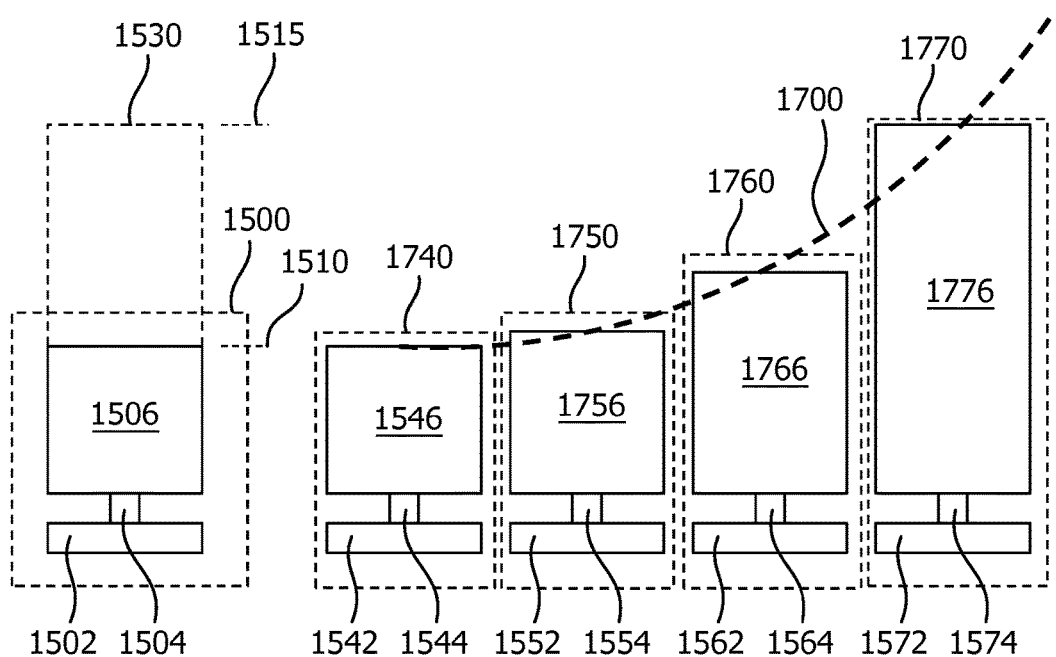
FIG. 17 shows schematically and exemplarily generating (a family of) lighting device designs based on the lamp hood length increasing based on a logarithmic function.

FIGS. 15, 16 and 17 show three examples of how lighting device designs can be generated based on a base lighting device design 1500. The base lighting device design 1500 comprises a stand 1502, a pillar 1504 and a lamp hood 1506. The height of the lamp hood 1506 of the base lighting device design 1500 is taken as a minimum height 1510, and a maximum height 1515 of the lamp hood is provided (e.g. as a user preference related variable or based on safety or production limitations). The area 1530 represents various possible heights of the lamp hood in lighting device designs that can be generated. In each of the three examples shown in respectively FIGS. 15, 16 and 17, four lighting device designs are generated (respectively 1540, 1550, 1560, 1570; 1640, 1650, 1660, 1670; and 1740, 1750, 1760, 1770) with the first design 1540, 1640, 1740 being a copy of the base lighting device design 1500. The stand 1542, 1552, 1562, 1572 and pillar 1544, 1554, 1564, 1574 are the same in each of the lighting device designs. Only the height of the lamp hood varies in this example, with the exception of the first lighting device design generated 1540, 1640, 1740 which is a copy of the base lighting device design 1500 and as such has a lamp hood 1546 similar to the lamp hood 1506 of the base lighting device design 1500.

FIG. 15 shows the generation of lighting device designs based on randomly determining a lamp hood height. This results in three lighting device designs 1550, 1560, 1570 being generated each with a lamp hood 1556, 1566, 1576 of various height. Although this example illustrates various lamp hood sizes, lighting device designs can be generated by varying lighting device design type (e.g. desk lamp, hanging lamp), color, contrast (e.g. use of contrasting colors in the lamp hood, use of matching colors for the lamp hood and the stand), material, decoration pattern, texture, size, style or other properties.

FIG. 16 shows the generation of lighting device designs based on determining the lamp hood height based on a linear distribution. The first lighting device design 1640 generated is similar to the base lighting device design 1500 and the fourth lighting device design 1670 generated comprises a lamp hood 1676 that matches the maximum height 1515 for the lamp hood. The two other lighting device designs 1650, 1660 that are generated have a lamp hood 1556, 1666 that are a third of the difference between the minimum height 1510 and maximum height 1515 apart from respectively the lamp hood 1546 of the first design 1640 and the lamp hood 1676 of the fourth design 1670. The line 1600 shows the relation between the height of the lamp hoods 1546, 1656, 1666, 1676. Other examples of lighting device designs generated based on such a distribution are color variations (e.g. where each lighting device design is 500 degrees Kelvin apart, or one of the components of the RGB value varies by a factor 10), size variations in other parts of the lighting device design (e.g. the stand, the width of the hood or the height of a standing lamp), density of a pattern (e.g. number of stripes per meter in a pinstripe pattern), etc.

FIG. 17 shows the generation of lighting device designs based on determining the lamp hood height based on a non-linear distribution. Again, in this example, the first lighting device design 1740 generated is similar to the base lighting device design 1500 and the fourth lighting device design 1770 generated comprises a lamp hood 1776 that matches the maximum height 1515 for the lamp hood. The two other lighting device designs 1750, 1760 that are generated have a lamp hood 1756, 1666, each following the line 1700 which represents an exponential distribution for the lamp hood height. Other theories and rules can be applied in generating lighting device designs, such as applying the 'golden ratio' or Fibonacci numbers. Similarly, tools related to color palettes and user preferences for colors can be used (e.g. Adobe Kuler service) as well as 'rules' related to color use such as complementary colors, adjacent colors, adjacent complementary colors, triads and tetrads. These are merely some examples of design rules that can be applied to lighting device design generation.

Figure 18:
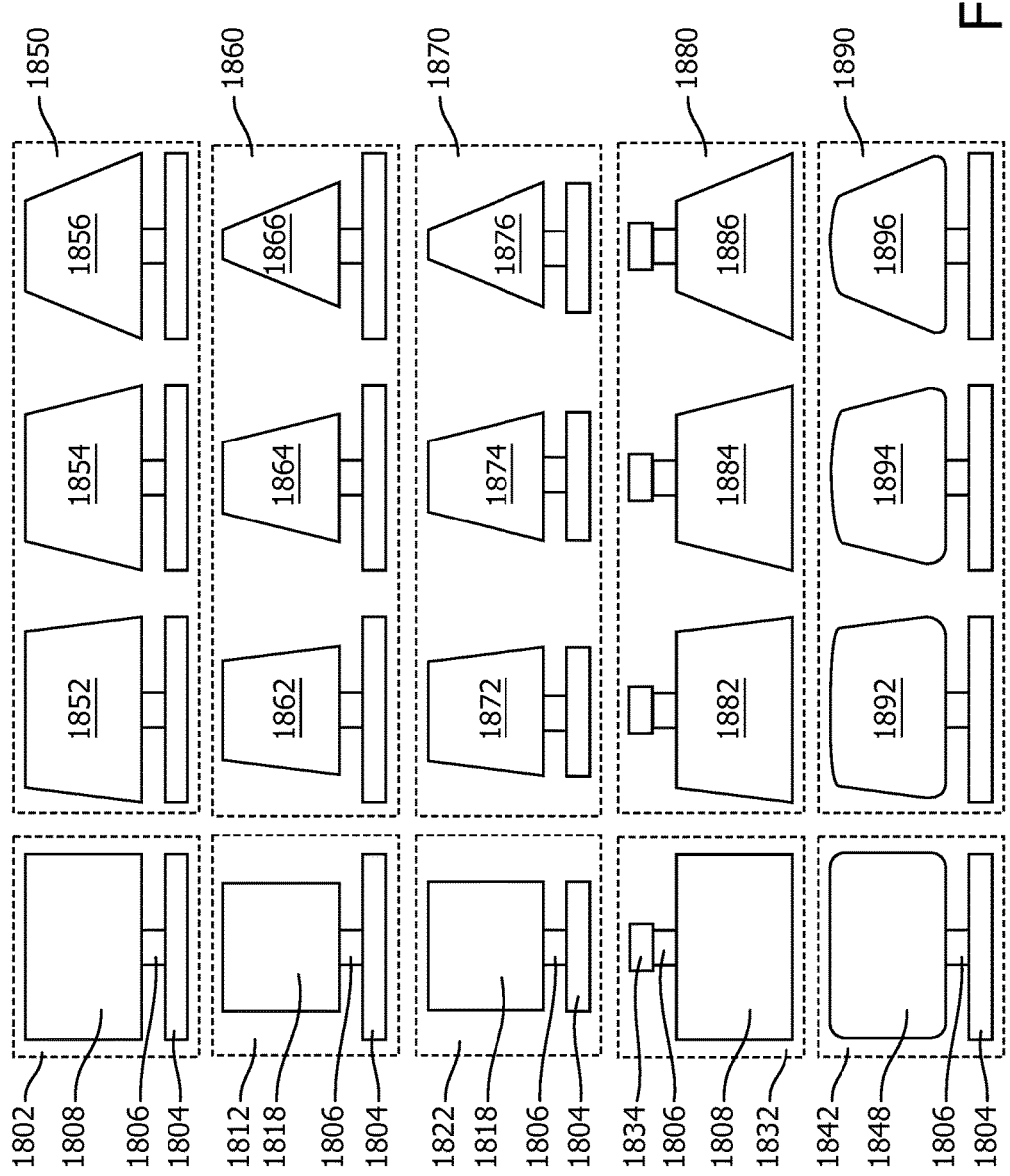
FIG. 18 shows schematically and exemplarily generating various lighting device designs.

FIG. 18 shows the generation of lighting device design families. A standing lamp design 1802 is used as the base lighting device design (e.g. this lighting device design was selected or designed by the user or the user has provided an image of a scene comprising this lighting device design). The base lighting device design 1802 comprises three elements: a stand 1804 a column 1806 and a lamp shade 1808. In this example four lighting device designs 1812, 1822, 1832, 1842 are generated based on varying the dimensions of one of these elements. For each of these four designs as well as for the base lighting device design 1802, three additional lighting device designs 1850, 1860, 1870, 1880, 1890 are generated through varying the shape of the lamp hood.

In this example, the first design 1812 comprises a lamp hood 1818 that is narrower (compared to the base lighting device design); and the second design 1822 comprises both the narrower lamp hood 1818 as well as a narrower stand 1824. For the third design 1822 the position of the lamp has been reversed (from standing to hanging), resulting in replacing the stand by a connector 1834 that allows for the lamp to be attached to a ceiling. The fourth design 1842 is again a standing lamp design, now with the corners of the lamp hood 1848 rounded. For each of the lighting device designs 1802, 1812, 1822, 1832, 1842 mentioned above, three further designs are generated by varying the shape of the lamp hood. Each design 1802, 1812, 1822, 1832, 1842 relates to a family of lighting device designs, respectively 1850, 1860, 1870, 1880, 1890. As an example, the base lighting device design 1802 provides a family 1850 comprising three designs 1852, 1854, 1856 each having a progressively more narrow top of the lamp hood. The other lighting device design families, 1860, 1870, 1880, 1890 also have lighting device designs 1862, 1864, 1866; 1872, 1874, 1876; 1882, 1884, 1886; 1892, 1894, 1896 that vary in a similar manner.

The user interface can display a lighting device design that has been generated, or a family of lighting device designs, in an iterative manner for the user to make a selection. As an example, the user can first be presented lighting device designs 1802, 1812, 1822, 1832, 1842 to make a first selection from and then, assuming the user has selected lighting device design 1842, be presented lighting device designs 1842, 1892, 1894, 1896 to make a final selection. This is merely one example of the generation of lighting device designs and lighting device design families.

Figure 19:
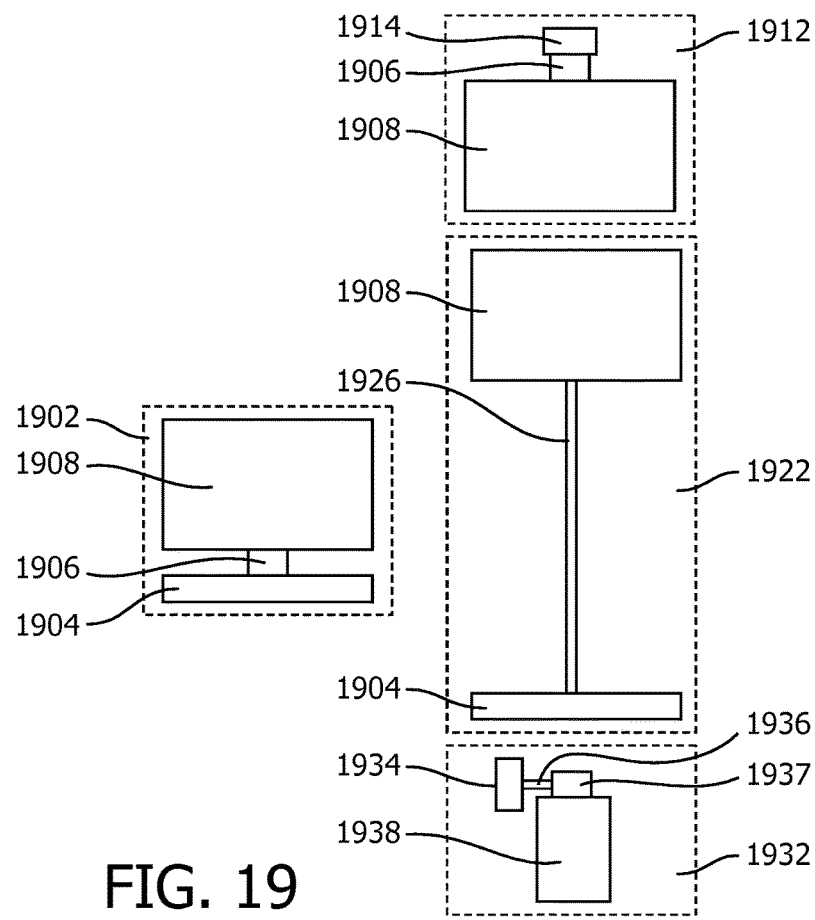
FIG. 19 shows schematically and exemplarily generating a lighting device design family for various lighting device design types.

FIG. 19 shows the generation of a family of lighting device designs where the family comprises various lamp types. In this example, the base lighting device design 1902 comprises a desk lamp, and this design is used to generate a hanging lamp design 1912, a standing lamp design 1922 and a wall mounted lamp design 1932. The base lighting device design 1902 comprises three elements: a stand 1904 a column 1906 and a lamp shade 1908. The lamp shade 1908 remains the same in the hanging lamp design 1912 and the standing lamp design 1922, as in the desk lamp design 1902. The stand 1904 is replaced by a connector 1914 in the hanging lamp design 1912 and another type of connector 1934 in the wall mounted lamp design, whereas it remains the same in the standing lamp design 1922. The hanging lamp design 1912 comprises the same column design 1906 as the desk lamp 1902. In the standing lamp design 1922 the column 1926 has been adapted to better fit this type of lighting device design, it has been made narrower and the height of the column 1926 has increased. The wall mounted lamp 1932 does not comprise a column; instead the column 1906 of the base lighting device design has been replaced by two components 1936, 1937 that couple the connector 1934 to the lamp hood 1938 which itself has been narrowed compared to the lamp hood 1908 of the desk lamp 1902. This is merely one example of the generation of a lighting device design family comprising various types of lighting device designs. In a similar manner, other lighting device designs (e.g. spotlights, integrated lights, table lights) can be generated.

Figure 20:
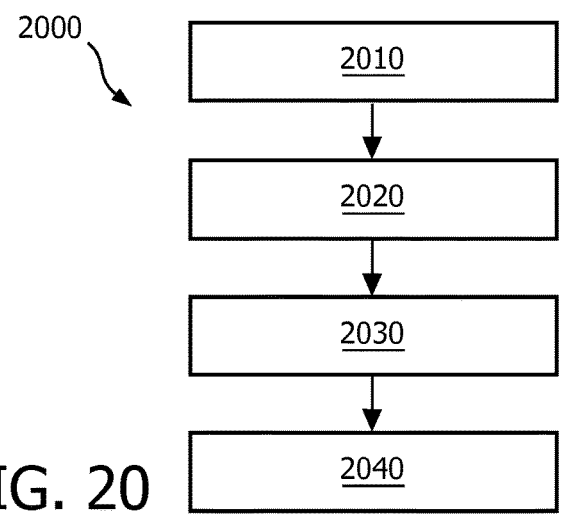
FIG. 20 shows schematically and exemplarily a method for assisting a user in selecting a lighting device design, through receiving an image of a scene and analyzing this image in order to provide a lighting device design.

FIG. 20 shows a method 2000, for assisting a user in selecting a lighting device design, through receiving an image of a scene and analyzing this image in order to provide a lighting device design. The method 2000 comprises four steps: In a first step 2010 an image of a scene is received, after which in a second step 2020 the image is analyzed in order to determine a scene related variable. This scene related variable is the basis for the third step 2030 of providing a lighting device design, which is then, in the fourth (optional) step 2040, displayed, through the user interface. The image of the scene can be received through a graphical user interface (e.g. by allowing a user to upload an image) or some other interface, such as an application programming interface (API). The latter can allow a user to capture an image or video using his/her mobile phone by calling the API of the camera application. The image of the scene can be, for example, an image of the user's bedroom for which he/she wants to select a lighting device design. As another example, the image of the scene can be an image of a room (e.g. the honeymoon suite of the hotel the user stayed at and which atmosphere he/she wants to recreate), a garden (e.g. the view of the garden from the room for which the user is selecting a lighting device design), or something else (e.g. a clipping from a magazine featuring a pattern the user appreciates) which the user wants to use as starting point for providing a lighting device design.

Analyzing the image can comprise determining a position in the scene for placing a lighting device, for example through object recognition. If it is determined that the scene comprises a ceiling, a lighting device design for a hanging lamp can be generated; if the scene comprises a bedside table a small desk lamp or a night light can be selected. Such lighting device designs can then be placed in a logical position based on object recognition. Similarly an open area can be detected where a standing lamp could fit, or in a more advanced application of the method suggestions can be made for the user to reposition furniture, a plant or existing lamps. In analyzing the image, alternatively or additionally, a color or a color palette can be determined that is used as a basis for providing lighting device designs. As an example, the color of the wall, ceiling or floor can be determined; or the color range that is most frequently used in the scene (e.g. yellow hues). Likewise, the image can be analyzed to determine what materials are present and could be used to select or generate a lighting device design that would match the material choices of the scene. If the scene comprises wood (e.g. a wooden floor, a view of a forest) and earth tone colors, a selection of a lighting device design comprising mostly natural materials can further enhance the atmosphere of the scene. As a further example, the scene can comprise patterns, such as patterns that are of a decorative nature. Some examples of patterns are: the width of wall paneling, a pattern printed on wall paper or the relationship between the size of windows present in the scene and the size of the wall area comprising these windows. Any one of these, and many other patterns detected, can be used as a basis for providing a lighting device design (e.g. generating a lamp hood with a stripe pattern that has the same stripe width to spacing ratio as the wall paneling). As yet a further example, the image of the scene can be analyzed to determine a style, such as the style that a room in the image of a living room is decorated in. Presence of few colors and little furniture can, for example, indicate a minimalist style, whereas the presence of floral patterns and pastel colors can indicate that a room is decorated in a romantic style. In a further embodiment, as part of the analysis, the user can be requested to provide input to validate analysis results (e.g. provide the user the question "Would you describe your living room as being decorated in an 'Avant Garde' style?") and/or to provide user preference related variables, such as favorite color (which can be used to select or generate a lighting device design), favorite music style (which can be used to select a color palette; e.g. dark colors for heavy metal or the colors of the Jamaican flag if the user is a Bob Marley fan).

Figure 21:
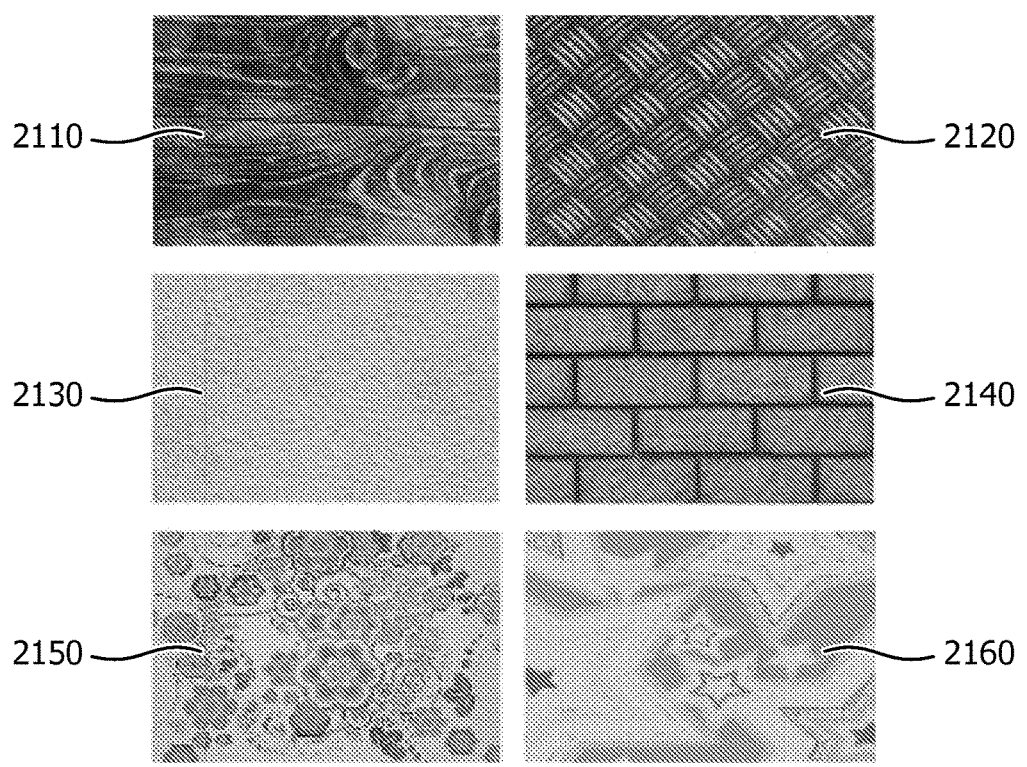
FIG. 21 shows schematically and exemplarily various materials, textures and patterns.

FIG. 21 shows some examples of images of materials, textures and patterns that can be recognized through image analysis. As a first example, wood, metal, wall plastering and concrete bricks can be detected in an image (respectively image 2110, 2120, 2130, 2140) based on, for example, color, pattern and texture analysis. As a second example, a pattern that is present in an object in the scene (e.g. wallpaper, curtains) can be detected in an image comprising the pattern 2150, 2160. As a further example, if the image comprises a floral pattern 2150, this floral pattern can be replicated to a lamp hood in a lighting device design; if the images comprises a fantasy pattern 2160 in the color pink, this can lead the analysis to determine that the room in the scene is the room of a teenage girl. These examples are illustrative of the analyses that can be performed on an image of a scene, there are however many more types of analysis that can be used to determine a scene related variable.

Figure 22:
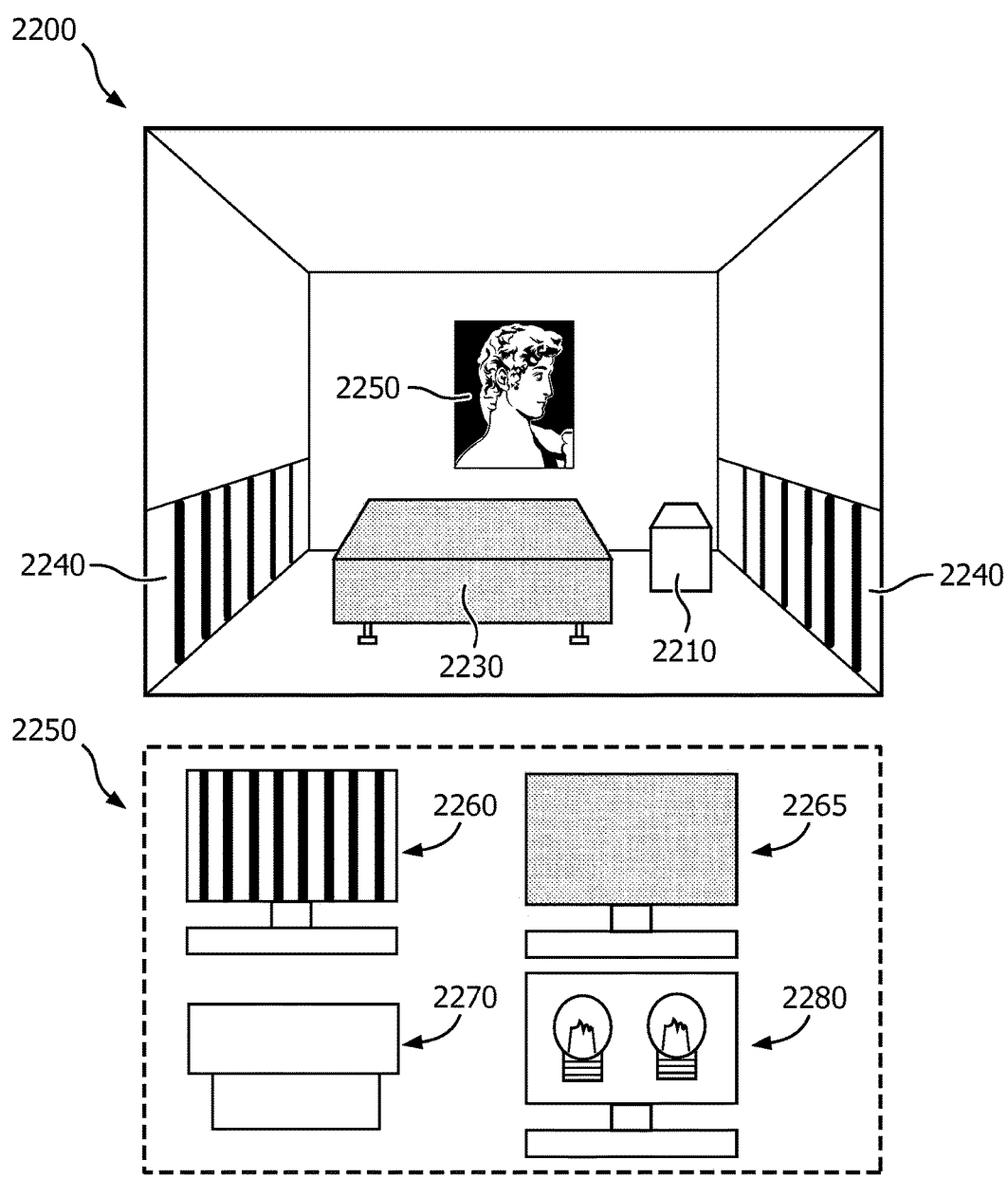
FIG. 22 shows schematically and exemplarily a scene comprising various materials, textures and styles and related lighting device designs.

FIG. 22 shows an image of a scene 2200 and a set 2250 of various lighting device designs that have been selected or generated based on analysis of the image 2200. In this example, analysis of the image of the scene has determined that the scene comprises a bedside table 2210 without a light. As such a set 2250 of four small bedside lamp designs are selected or generated. The scene comprises a bed with a linen texture 2230, wall paneling with a vertical stripe pattern 2240 and a classical painting 2250. Furthermore, the room in the scene does not comprise a ceiling lamp nor windows. The set 2250 of lighting device designs that are selected or generated based on the analysis of the image of the scene comprises four lighting device designs: two designs 2260, 2265 that are generated and two designs 2270, 2280 that have been selected (e.g. from an electronic catalogue of lighting device designs). One design 2260 is generated based on the image analysis having determined a stripe pattern as a scene related variable (e.g. the variable can be the pattern; or the color, spacing and/or width of the stripes), another design 2265 is generated based on the image analysis having determined that a linen texture is present in the scene. In these two examples, the lighting device design 2260, 2265 respectively include the pattern or the texture (e.g. the material choice) in the lamp hood. A further two designs 2270, 2280 are selected from a set of lighting device designs (e.g. from the set of lighting device designs available for sale through an online retailer). One design 2270 is of a classical style (e.g. selected from a range of lighting device designs that are listed in an electronic catalogue as neoclassical) and relates to the presence of the classical painting 2250 in the image of the scene 2200; the other design 2280 is a basic desk lamp design but comprises two light sources and relates to the detection of a lack of other lighting device designs or windows in the scene. As another example, the selection or generation of a lighting device design can comprise a process involving the user making multiple selections for each of: type of lamp (e.g. bedside table lamp), size of lamp (e.g. medium), type of light source (e.g. high power LED), fabric of lamp hood (e.g. linen) and pattern printed on fabric (e.g. stripes) in order to guide the user through the generation process.

Figure 23:
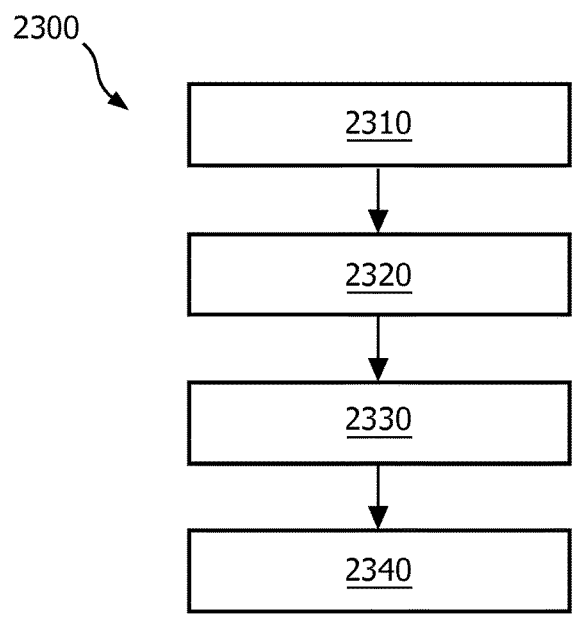
FIG. 23 shows schematically and exemplarily the method according to the invention.

FIG. 23 shows a method 2300 for suggesting a lighting device design to a user. In a first step 2310, user interest information is acquired. This user interest information can be acquired from sources such as an (online) user profile (e.g. a Facebook profile, a customer profile), input the user has provided (e.g. a search query, an email message the user has written), content the user is consuming (e.g. a website the user is visiting, a video the user is viewing) or the location a user has visited or is at (e.g. based on GPS coordinates of the user's smart phone, location information included in EXIF data related to a picture the user has taken or details of a user's travel plan included in an agenda or a hotel booking). In a second step 2320 a lighting device design related variable based on the acquired user interest information is determined. Examples of design related variables of a lighting device design are the size, shape, color, material of (part of) the lighting device design, the lighting properties (e.g. brightness, light distribution) of the lighting device design, the type (e.g. standing lamp, ceiling lamp) of the lighting device design, etc. Some examples of determining lighting device design related variables based on user interest information are: analyzing photos in the user's photo collection (e.g. stored in the user's profile) to determine a preference for a color, material or style (e.g. based on selecting photos of the user's home and analyzing the color of the walls, the material of the flooring and decorative elements present, such as Buddha statues, posters of singers and entertainers, etc.); analyzing a user's posts (e.g. on Facebook, Google+), Twitter messages, email messages, 9Gag or Pinterest postings, etc. for keywords that convey an emotional state (e.g. madly in love, stressed for an upcoming exam) or the occurrence of a (life) event (e.g. an upcoming concert, a romantic date for Valentine's day) which can indicate a preference for a shape (e.g. a heart shaped lighting device to reflect love), a color (e.g. red or pink to reflect love), a print or pattern (e.g. based on the user's favorite band, brand or Internet meme) or a lighting device type (e.g. a desk lamp for studying for an exam, preferably with light properties, such as the color and intensity of the light, that enhance concentration); or analyzing location information to assess where the user lives, vacations, works etc. to determine a print (e.g. the local sports team), a style (e.g. an African themed lighting device design if the user has been on holiday in Africa) or type of lighting device (e.g. a Philips Wake-up light if the distance between the user's home and work location is large and (s)he could use some help in waking up comfortably). The acquired user information can relate directly to the user; alternatively or additionally user information related to friends of the user can be acquired (e.g. analyze postings made by a friend or family member of the user on Facebook). Although examples are provided of how keywords, images and locations can be acquired as user interest information, these are merely examples of types of user interest information that can be acquired. Data that is not in a user-readable format, such as variables related to user activity, can additionally or alternatively be acquired as user interest information. Such variables can be stored in a database comprising, for example, transaction information (e.g. earlier purchase behavior of a user), user data points (e.g. based on data mining or user profiling), etc.

In a third step 2330 a lighting device design is provided based on the lighting device design related variable; and in a fourth step 2340 an image of the provided lighting device design is displayed to the user. The lighting device design can incorporate lighting device design related variables, for example a lighting device design can be generated which comprises a print (e.g. a photo of the user's pet) on the lamp hood. As another example, a lighting device design can be selected (e.g. from a catalogue of lighting device designs) based on a color that is part of the user interest information, such as selecting a green lamp if the user, based on photos stored in his/her Flickr account of him/herself wearing green clothing items, seems to like this color. The image of the provided lighting device design can, for example, be displayed to the user as part of an advertisement on a website the user is visiting, as a suggestion in a lighting device design tool (e.g. a computer aided design application) or integrated in an image or video the user is viewing (e.g. when the user is shopping for a couch online, an image of a living room featuring the couch can further comprise the lighting device design provided using this method). The advertisement can comprise a link to a website where a lighting device according to the lighting device design can be purchased. Such a link can comprise the lighting device design (e.g. variables needed to generate the lighting device design can be part of the Uniform Resource Locator), a reference to the lighting device design (e.g. a link to a model of the lighting device design) or user interest information enabling the lighting device design to be provided (e.g. generated) once more, now by the website offering it for sale. The lighting device design can comprise parts that are manufactured, for example, using an additive manufacturing process (e.g. 3D printed), and parts that are readily available (e.g. generic parts). All parts or components needed to produce the provided lighting device design can be combined into a package for shipment to the user (e.g. with an assembly manual included or preassembled).

Figure 24:
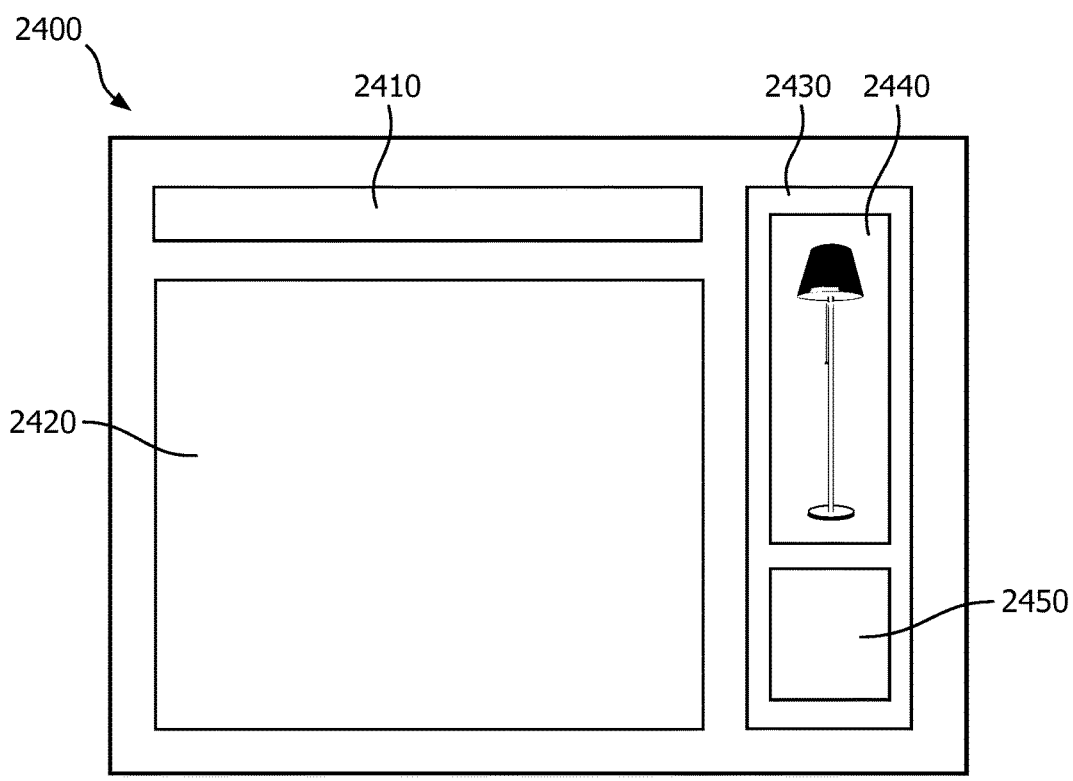
FIG. 24 shows schematically and exemplarily a website comprising a banner comprising an image of a lighting device design.

FIG. 24 shows a website 2400 as displayed to a user (not shown). The website 2400 comprises a header 2410 (e.g. a title of an article) and a body 2440 (e.g. the article itself) as well as an advertisement 2430 for a lighting device design. The advertisement comprises an image 2440 of a lighting device design and pricing data 2450 (or other information related to the lighting device design, such as brand name, model name, ordering information or a call for action, such as "click here to order"). The advertisement 2430 can be a separate frame in the website 2400 and be loaded from a server other than the server providing the rest of the website (e.g. the article), the advertisement can be loaded through an advertising network (e.g. DoubleClick, AdSense), etc. The image 2440 of the lighting device design is displayed as part of the method according to the invention. In this example, user interest information can be acquired based on scanning the body 2420 for keywords (e.g. the presence of "living room" and "decoration" in the text of the article) possibly in combination with user interest information acquired from the user's Facebook profile (e.g. the website 2400 can incorporate an API allowing the user, logged into his/her Facebook account, to post a comment and at the same time allowing the website to access the user's Facebook profile). The user reading an article on decorating a living room, in combination with a Facebook post of a photo of a house (presumably the house the user has recently moved to) can lead to determining a lighting device design type (a standing lamp) and a lighting device design style (e.g. colonial, if the house in the photo has colonial features such as a white porch) as lighting device design related variables. Using these two lighting device design related variables, the method can provide a lighting device design. For example, a lighting device design can be selected from a catalogue, a lighting device design can be generated (e.g. if the catalogue does not comprise a lighting device design that matches the two lighting device design related variables) or part of a lighting device design can be generated with the image 2440 showing this partial design in the context of the graphical user interface of a design tool and the advertisement 2430 further comprising a call for the user to complete the design to his/her liking (e.g. below the image, instead or on top of pricing information 2450).

Figure 25A:
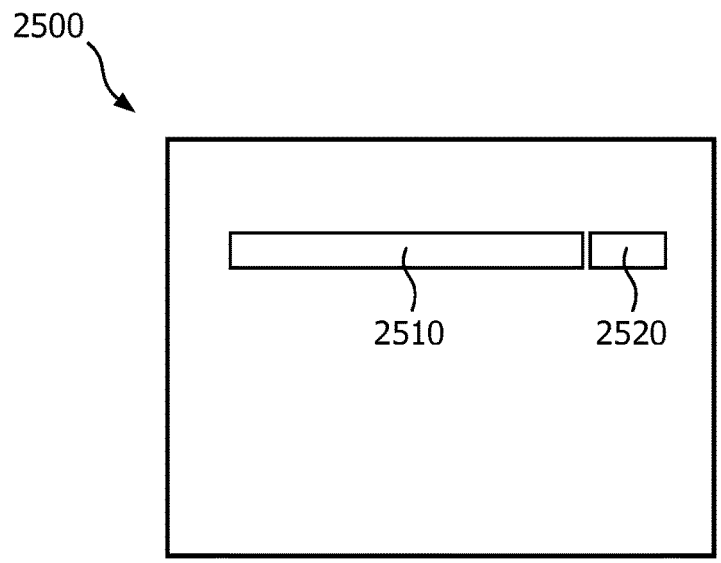
FIGS. 25A and 25B show schematically and exemplarily a search tool where respectively a query is entered and results for the query are displayed.
Figure 25B:
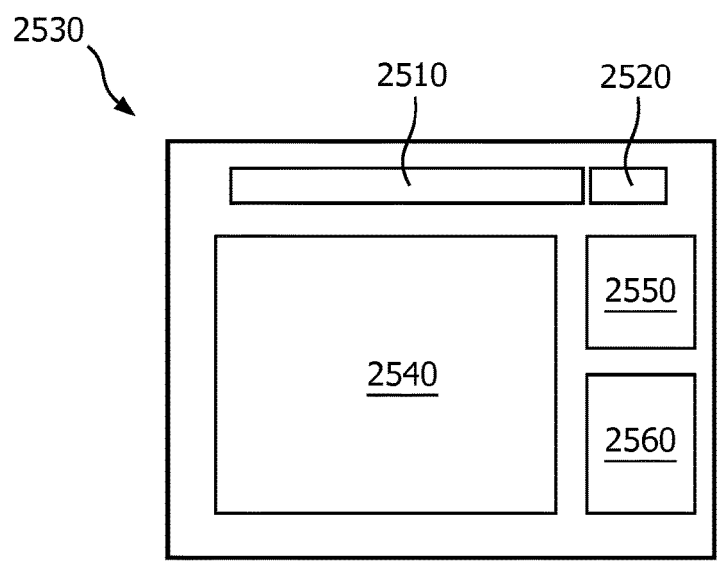

FIGS. 25A and 25B show a search tool 2500 provided as a website (e.g. Google, Yahoo, Baidu or another search engine) where a user enters a search query (FIG. 25A) and gets the results (FIG. 25B) of this search query. The user can enter the search query into a search query input field 2510 and can click on a button 2520 to execute the search. The results page 2530 shows the results list 2510 (e.g. clickable links to websites) as well as a first 2550 and second advertisement 2560. One (or both) of these can be an advertisement comprising an image of a lighting device design as per the method according to the invention. In another example, the search results are images and an image of a lighting device design is include in the results (e.g. as if it were a regular search query result).

Figure 26:
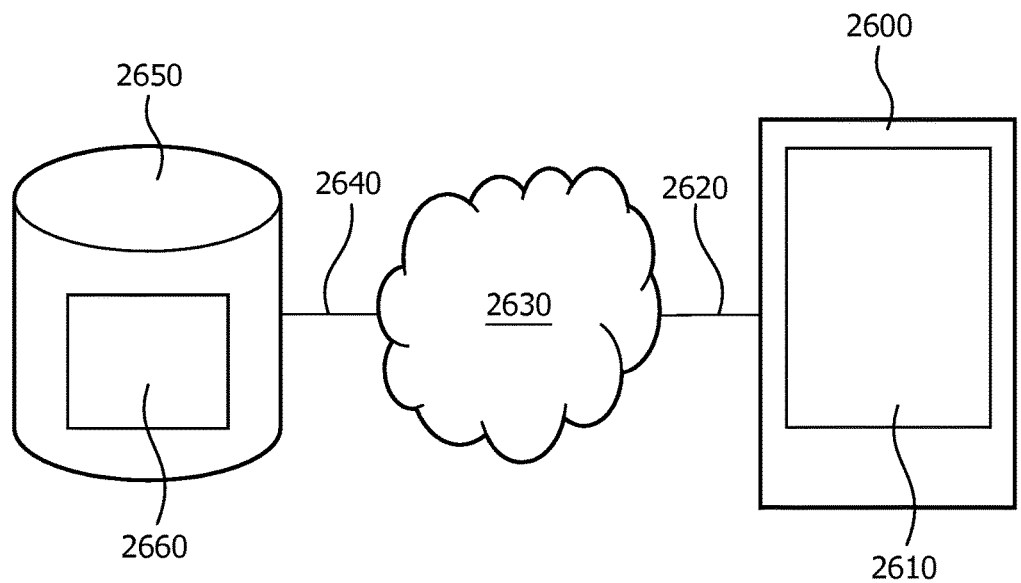
FIG. 26 shows schematically and exemplarily a mobile device connected through a network to a database comprising a profile of a user.

FIG. 26 shows a computer device 2600 with a display 2610 and a first connection 2620 to a network 2630 (e.g. the Internet). The network 2630 provides a second connection 2640 to a data source 2650 (e.g. a database, a website, a server) comprising a profile of a user 2660. The computer device 2600 can be a smartphone, a tablet computer, a laptop computer, a desktop, a (3D) camera or any other type of device arranged for executing a computer program. The display 2610 can display an image of a lighting device design according to the method of the invention. Such an image can be displayed, for example, when a user starts an application arranged for suggesting a lighting device design or it can be displayed as part of an advertisement in an application (e.g. a banner at the bottom of the screen when the user plays a game on the computer device 2600). Displaying the image of the lighting device design can be triggered by the application the user executes on the computer device or it can be pushed, for example, as a message (e.g. a notification on a notification screen or lock screen) by a server (e.g. an advertising service running on a server connected to the computer device 2600 via the Internet). As a first example, the user can start an application on the computer device 2600 which connects to the data source 2650 through the network 2630 via a wireless Internet connection (e.g. GPRS, UMTS, WiFi). The application then acquires user interest information from this data source 2650, in this case the user profile 2660 pertaining to this user. The user profile can be acquired as user interest information based on identifying the user (e.g. through a cookie placed on the computer device 2600), by identifying the computer device 2600 (e.g. through a processor identifier, a MAC address), by identifying the connection (e.g. through an IP address) or any other means. The application can then analyze the user profile to determine a lighting device design related variable, such as analyzing the music the user has played through accessing his/her Spotify profile (or another streaming music service) to determine 'jazzy' as a lighting device design style. The application can then select a lighting device design that is marked as having a 'jazzy' style from a collection of lighting device designs (e.g. through an online service) and display an image of this selected lighting device design. As a second example, the various steps of acquiring user interest information, determining a lighting device design variable and providing a lighting device design can be performed by a server, such as the server running the database that functions as data source 2650. The computer device 2600 can then access a website hosted by the server, where the website comprises an advertisement for a lighting device design.

Figure 27:
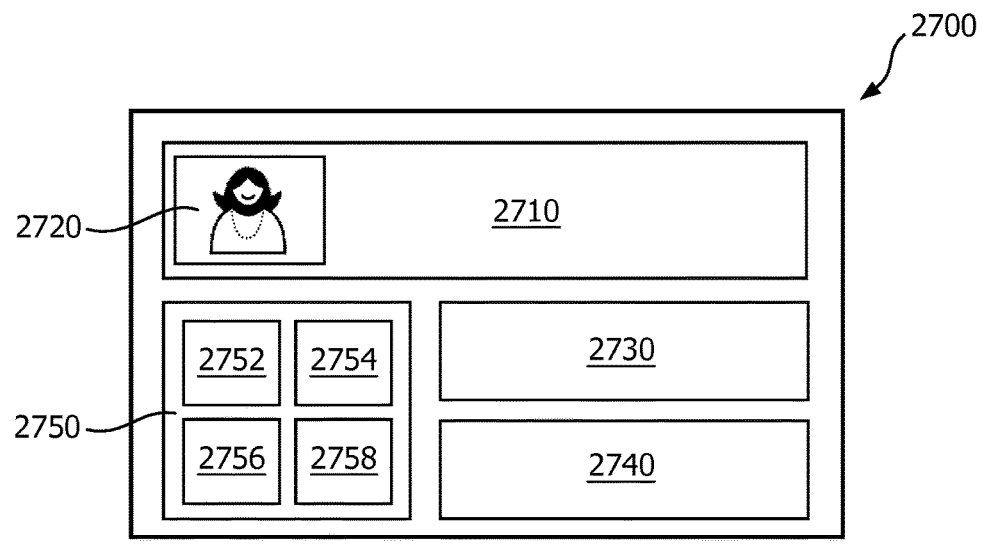
FIG. 27 shows schematically and exemplarily a profile of a user.

FIG. 27 shows a user profile 2700 in a human readable format (e.g. as it would be displayed through a website). Alternatively or in addition, the profile could be acquired directly through an interface with, for example, a database which stores the user profile data. The user profile 2700 comprises a theme 2710 (e.g. a background image, a color or a general theme for the profile that determines font, formatting and other aspects of the appearance of the user profile 2710) and a profile picture of the user 2720. The profile 2700 further comprises posts 2730, 2740 the user has made (e.g. posts that provide status updates to friends or posts made automatically by applications that share information regarding what article the user has read on a news site, what music the user is listening to or which movie the user has bought tickets for and will see tonight) and a collection of photos 2750 where each photo 2752, 2754, 2756, 2758 can link to a photo album or a larger size image. Applying the method according to the invention, user interest information such as the text of a post 2730, the user profile picture 2720 or a photo 2752 can be acquired. A lighting device related variable can be determined based on this user interest information. For example, a post 2730 made by the user to notify friends of the birth of a child can lead to determining as a lighting device design related variable a lighting device design type, such as a 'nightlight' (e.g. based on keywords such as "birth" or "delivery"; or based on an image of a baby being posted); the user profile picture 2720 can lead to determining as a lighting device design related variable a color (e.g. based on the color of the shirt the user is wearing in the user profile picture 2720); or a photo 2752 of a vacation destination can lead to a print or style being determined as a lighting device design related variable (e.g. a photo showing a New York city landmark such as the Statue of Liberty can lead to providing a lighting device design that shows a New York skyline).

The user profile 2700 need not necessarily be a profile hosted through a generic service (e.g. Facebook, MySpace, Google+), but can also be a local profile stored on a device (e.g. search history stored in a browser on the user's laptop) or a profile created of a user in an online store selling lighting devices (e.g. user interest information related to earlier purchases and lighting device designs viewed). User interest information can be acquired from any source and can be based on user input (e.g. searches performed, messages posted or sent), user activity (e.g. where or when a user has gone online, what websites were visited), output provided to the user (e.g. what advertisements were shown earlier), etc.

In this application, "providing" a lighting device design can refer to selecting a lighting device design from a set of lighting device designs (such as from one or more lighting device designs in an electronic catalogue). Providing a lighting device design can also refer to generating a lighting device design or multiple lighting device designs for selection by the user. Providing a lighting device design can also refer to the user designing a lighting device design (and optionally assisting the user in designing a lighting device design) for selection upon completion of the design process. Where the phrase providing a lighting device design is used, one could instead read at least one of selecting, designing or generating a lighting device design.

The user selecting a lighting device design (or a lighting device design property, a preference, a lighting property, etc.) can be an explicit selection, such as the user providing input through an input device (e.g. a keyboard, mouse, touch interface) in order to select a lighting device design (or a lighting device design property, a preference, a lighting property, etc.). It is however not limited to such explicit actions, but instead, in an embodiment, can also include the user implicitly selecting a lighting device design (or a lighting device design property, a preference, a lighting property, etc.). Such implicit selections can be based on the detecting the user's gaze, the amount of time spent viewing a certain lighting device design, the user hovering over a lighting device design (e.g. the user hovering a mouse pointer or the user hovering his/her finger over a touch input device) or the frequency of viewing a lighting device design.

It should be noted that the above-mentioned embodiments illustrate rather than limit the invention and that those skilled in the art will be able to design alternative embodiments without departing from the scope of the appended claims. In the claims, any reference signs placed between parentheses shall not be constructed as limiting the claim. The word 'comprising' does not exclude the presence of elements or steps not listed in a claim. The word "a" or "an" preceding an element does not exclude the presence of a plurality of such elements. The invention can be implemented by means of hardware comprising several distinct elements and by means of a suitable programmed computer. In the unit claims enumerating several means, several of these means can be embodied by one and the same item of hardware or software. The usage of the words first, second and third, etcetera do not indicate any ordering. These words are to be interpreted as names. No specific sequence of acts is intended to be required unless specifically indicated.

The invention claimed is:

1. A method for suggesting a lighting device design to a user, the method comprising the steps of:
    acquiring, by a server, user interest information relating to the user, from one or more data sources;
    acquiring, by the server, a first scene comprising data representing a first physical space, wherein said first scene is one of a set of scenes representing respective physical spaces stored in a repository;
    determining, by the server, a lighting device design related variable based on the acquired user interest information and on analysis of the data;
    providing, by the server, a first lighting device design based on the lighting device design related variable, wherein the first lighting device design is one of a set of lighting device designs stored in the repository separately from the set of scenes, and a first lighting effect, wherein the first lighting effect is one of a set of lighting effects stored in the repository separately from the set of scenes and separately from the set of lighting device designs;

rendering a composite image of the first lighting device design by combining the first scene, the first lighting device design and the first lighting effect into the composite image; and displaying the composite image of the first lighting device design.

2. The method of claim 1, further comprising the step of determining a lighting property of the first lighting device design based on the acquired user interest information and/or the context in which the first lighting device design will be displayed; and wherein the first lighting effect is determined based on the determined lighting property of the first lighting device design.

3. The method of claim 1, wherein the step of acquiring user interest information comprises acquiring a keyword related to the user; and wherein the step of determining a lighting device design related variable is based on the acquired keyword.

4. The method of claim 3, wherein the keyword related to the user is a word from a search query entered by the user.

5. The method of claim 3, wherein the keyword related to the user is a word stored in a user profile of the user.

6. The method of claim 1, wherein the step of acquiring user interest information comprises acquiring an image related to the user; and wherein the step of determining a lighting device design related variable is based on an analysis of the acquired image related to the user.

7. The method of claim 1, wherein the step of acquiring user interest information is based on the user's location; and wherein the step of determining a lighting device design related variable is based on an analysis of the user's location.

8. The method of claim 1, wherein the step of providing the first lighting device design is further based on user interest information related to at least one other user.

9. The method of claim 1, wherein the step of displaying the composite image of the generated lighting device design comprises displaying an advertisement featuring the composite image of the first lighting device design.

10. The method of claim 1, wherein said server performs the analysis of the data such that the server further determines at least one of a dominant style associated with the first scene or the most contrasting color in the first scene.

11. The method of claim 10, wherein said server performs the analysis of the data such that the server determines the dominant style associated with the first scene, wherein the dominant style is a decorative style.

12. The method of claim 11, further comprising installing at least one lighting device in said first physical space based on the first lighting device design.

13. The method of claim 1, wherein the first scene is an image, the first lighting device design is an image and the first lighting effect is an image, and wherein the rendering comprises blending pixel values of the images of the first scene, the first lighting device design and the first lighting effect such that the first lighting device design and the first lighting effect are layered over the first scene.

14. The method of claim 1, further comprising installing at least one lighting device in said first physical space based on the first lighting device design.

15. A system for suggesting a lighting device design to a user, the system comprising:

a first interface for acquiring user interest information;

a repository comprising a set of scenes representing respective physical spaces, a set of lighting device designs stored in the repository separately from the set of scenes, and a set of lighting effects stored in the repository separately from the set of scenes and separately from the set of lighting device designs;

a second interface for acquiring a first scene of the set of scenes from the repository;

a processor configured to determine a lighting device design related variable based on the acquired user interest information and on analysis of the first scene, and wherein the processor is configured to determine a first lighting device design of the set of lighting device designs based on the lighting device design related variable, to determine a first lighting effect of the set of lighting effects and to render a composite image of the first lighting device design by combining the first scene, the first lighting device design and the first lighting effect into the composite image; and a third interface for displaying the composite image of the first lighting device design.

16. The system of claim 15, wherein said processor is configured to perform said analysis such that the processor further determines at least one of a dominant style associated with the first scene or the most contrasting color in the first scene.

17. The system of claim 16, wherein said processor is configured to perform said analysis such that the processor determines the dominant style associated with the first scene, wherein the dominant style is a decorative style.

18. The system of claim 17, further comprising a lighting device that is configured in accordance with the first lighting device design and is installed in a first physical space represented by the first scene based on the first lighting device design.

19. The system of claim 15, wherein the first scene is an image, the first lighting device design is an image and the first lighting effect is an image, and wherein the processor is configured to render the composite image by blending pixel values of the images of the first scene, the first lighting device design and the first lighting effect such that the first lighting device design and the first lighting effect are layered over the first scene.

20. The system of claim 15, further comprising a lighting device that is configured in accordance with the first lighting device design and is installed in a first physical space represented by the first scene based on the first lighting device design.

* * * * *